(12) United States Patent
Saito

(10) Patent No.: US 6,958,500 B2
(45) Date of Patent: Oct. 25, 2005

(54) SEMICONDUCTOR DEVICE HAVING LOW RESISTIVITY SOURCE AND DRAIN ELECTRODES

(75) Inventor: Tomohiro Saito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 120 days.

(21) Appl. No.: 10/683,280

(22) Filed: Oct. 14, 2003

(65) Prior Publication Data

US 2004/0115890 A1    Jun. 17, 2004

(30) Foreign Application Priority Data

Oct. 28, 2002    (JP) ........................... P2002-312994

(51) Int. Cl.[7] ........................ H01L 29/76; H01L 29/94; H01L 31/062; H01L 31/113
(52) U.S. Cl. ........................ 257/288; 257/382; 257/387
(58) Field of Search ................................ 257/288, 368, 257/374, 377, 382, 384, 387

(56) References Cited

U.S. PATENT DOCUMENTS

| | | | |
|---|---|---|---|
| 6,054,355 A | 4/2000 | Inumiya et al. | 438/296 |
| 6,274,421 B1 | 8/2001 | Hsu et al. | 438/233 |
| 6,346,438 B1 | 2/2002 | Yagishita et al. | 438/197 |
| 6,445,050 B1 * | 9/2002 | Chediak et al. | 257/401 |
| 6,515,338 B1 * | 2/2003 | Inumiya et al. | 257/368 |
| 6,853,028 B2 * | 2/2005 | Kim et al. | 257/315 |

* cited by examiner

Primary Examiner—Phuc T. Dang
(74) Attorney, Agent, or Firm—Finnegan, Henderson, Farabow, Garrett & Dunner, L.L.P.

(57) ABSTRACT

A dummy gate crossing an active area having ends in contact with an isolation area is formed. A low area lower than a dummy gate is formed in the isolation area. Side walls are formed in the active area except the dummy gate. A semiconductor film having the same height as that of the dummy gate is formed in the low area. An oxide film is formed on the semiconductor film. The dummy gate is removed by the oxide film as a mask. The oxide film is removed by the semiconductor film as a stopper.

14 Claims, 43 Drawing Sheets

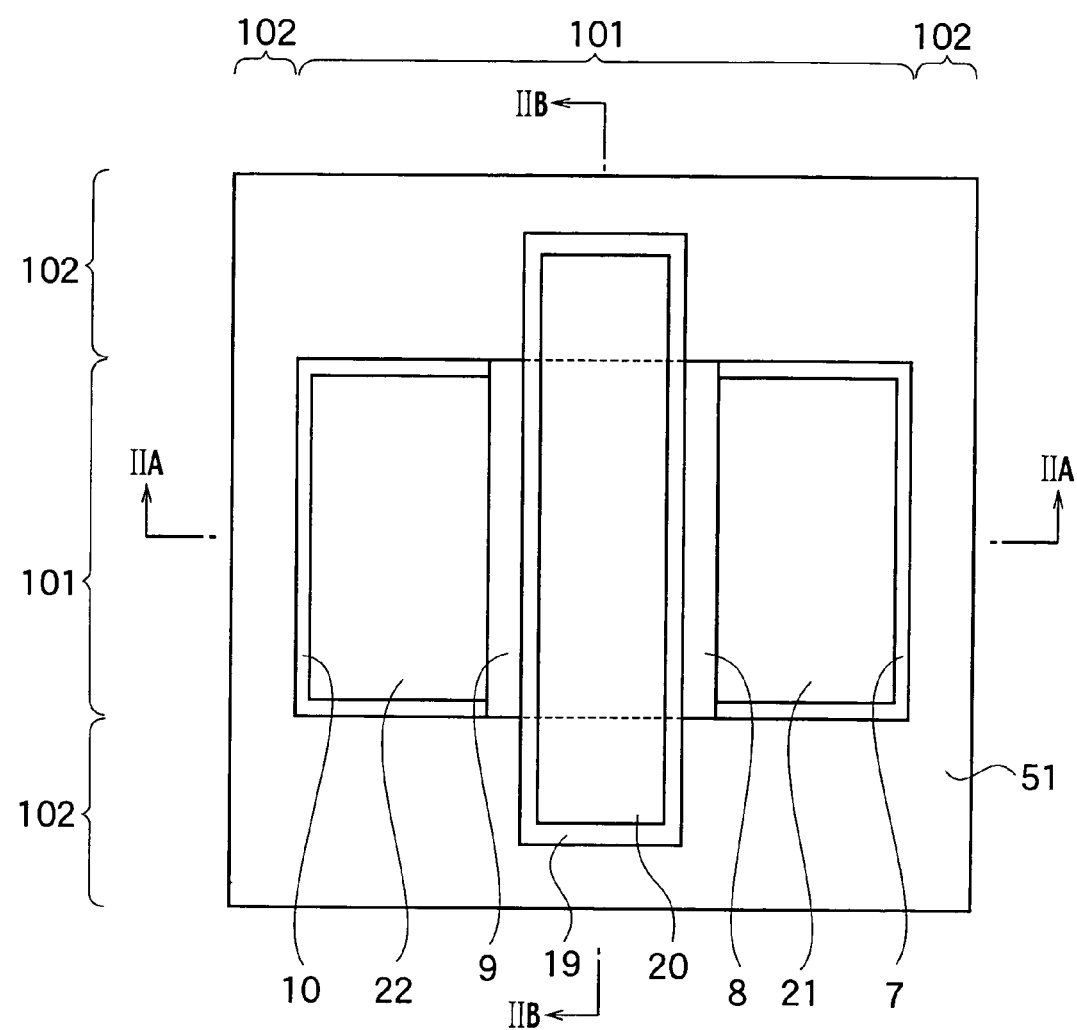

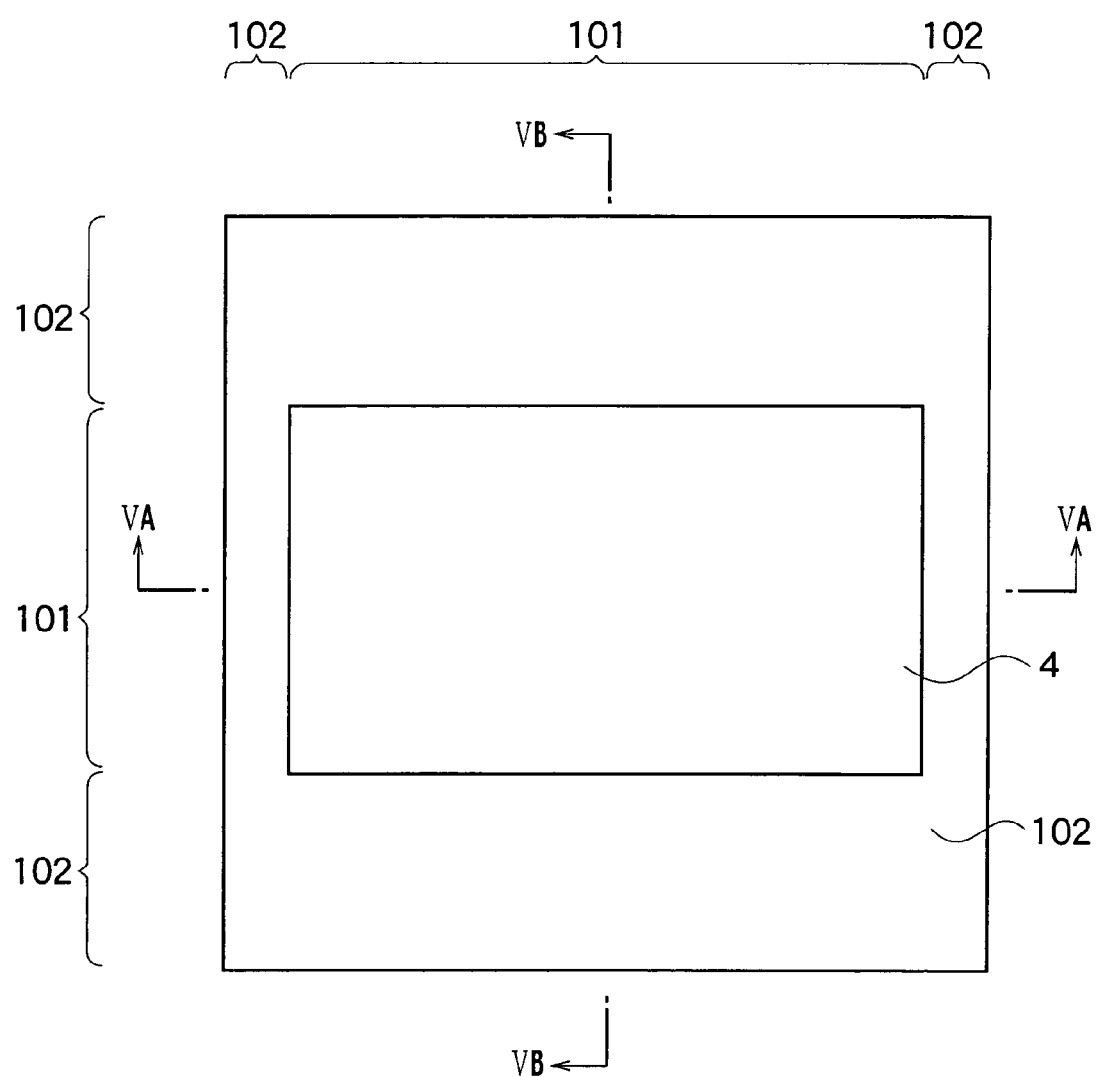

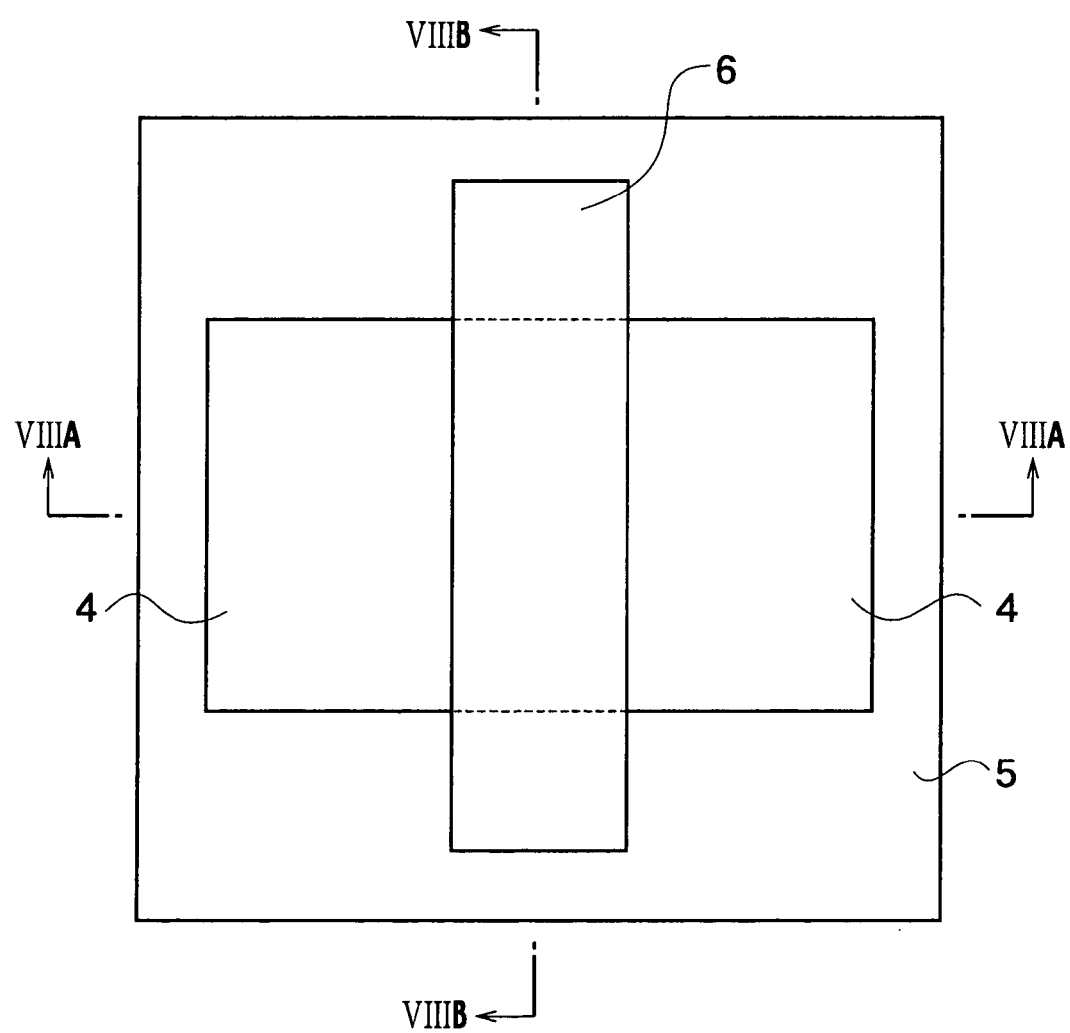

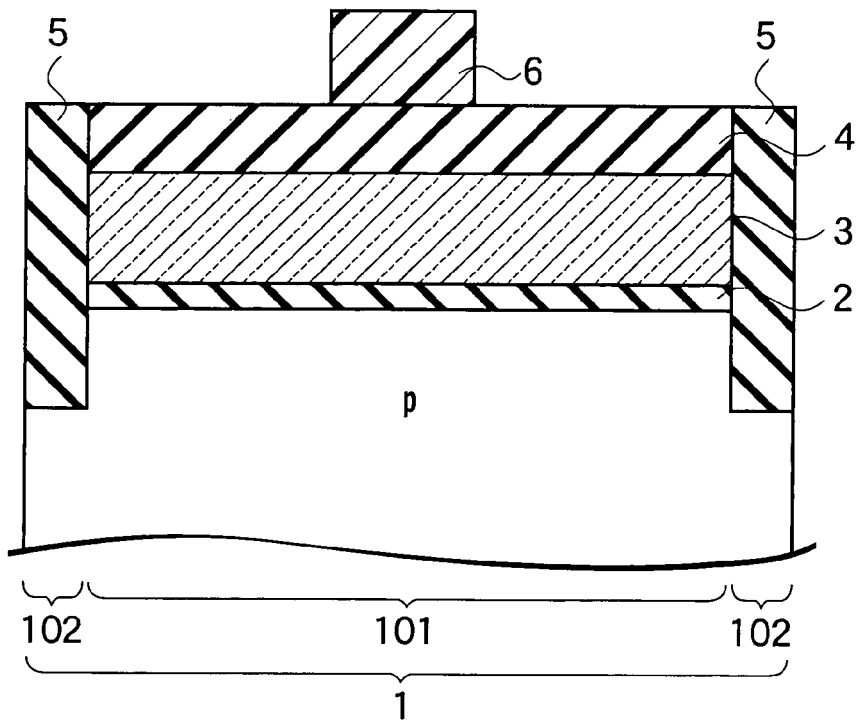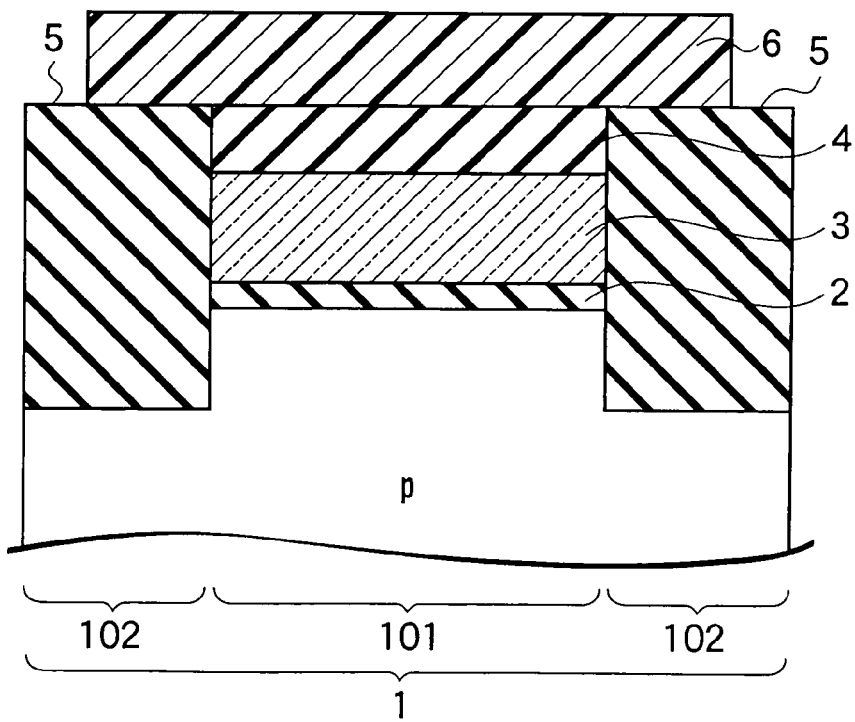

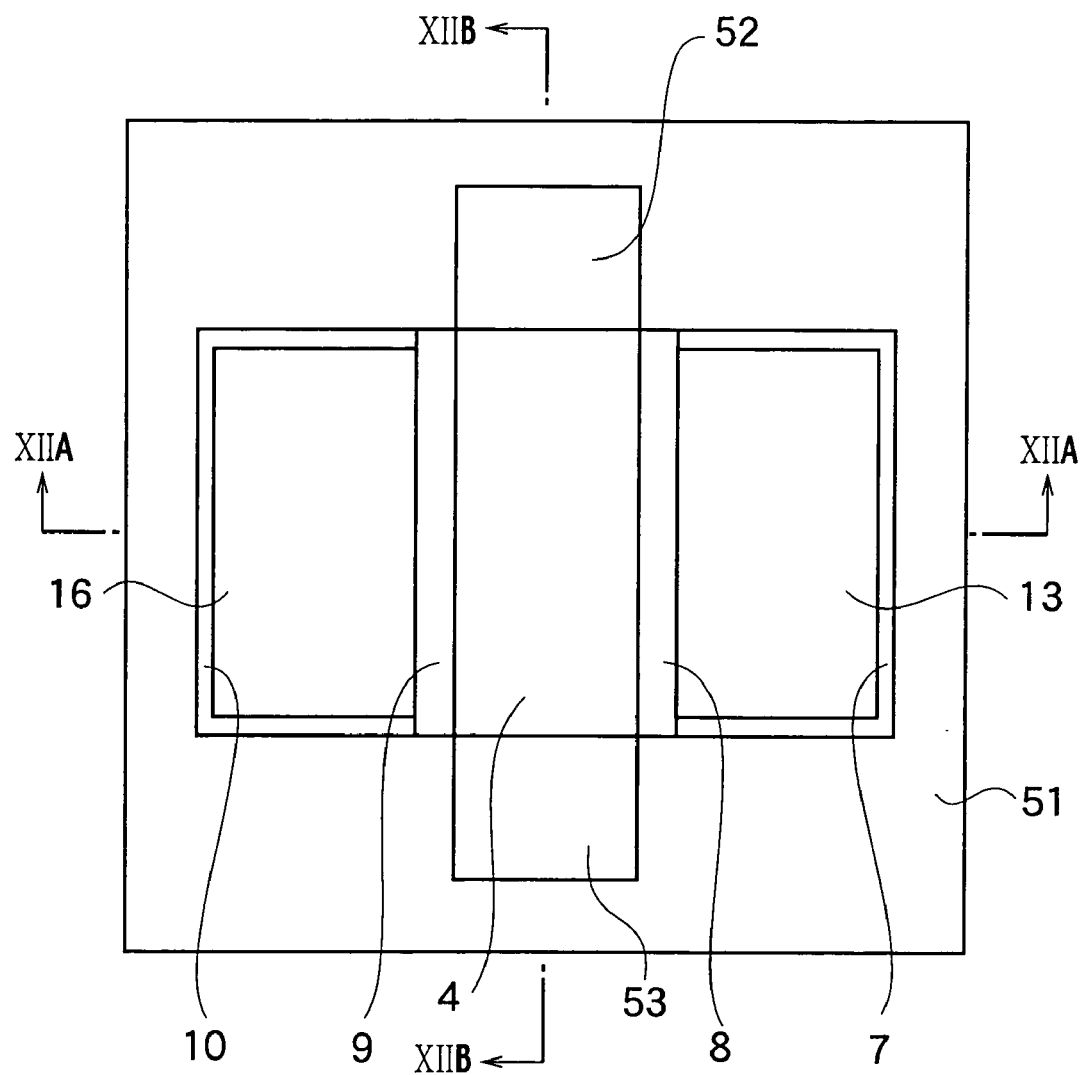

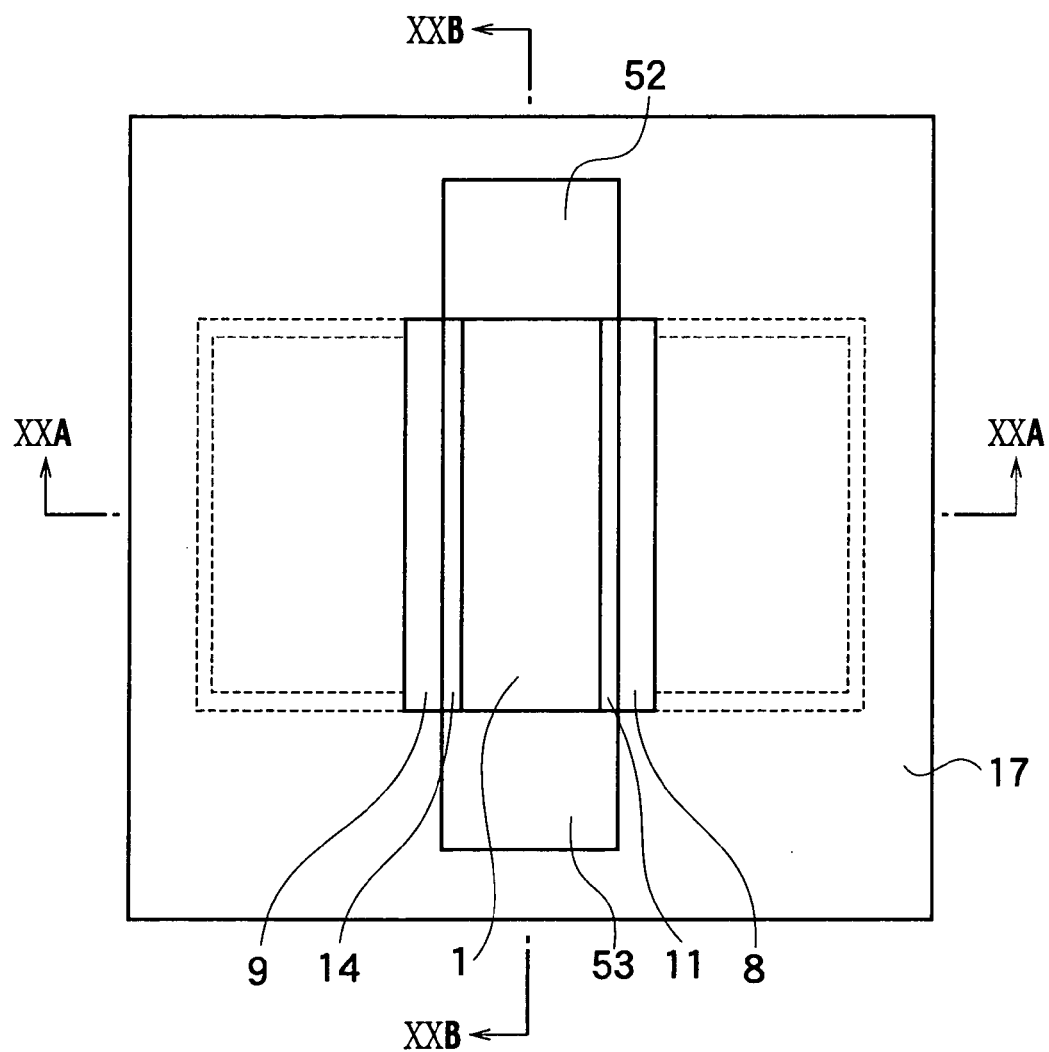

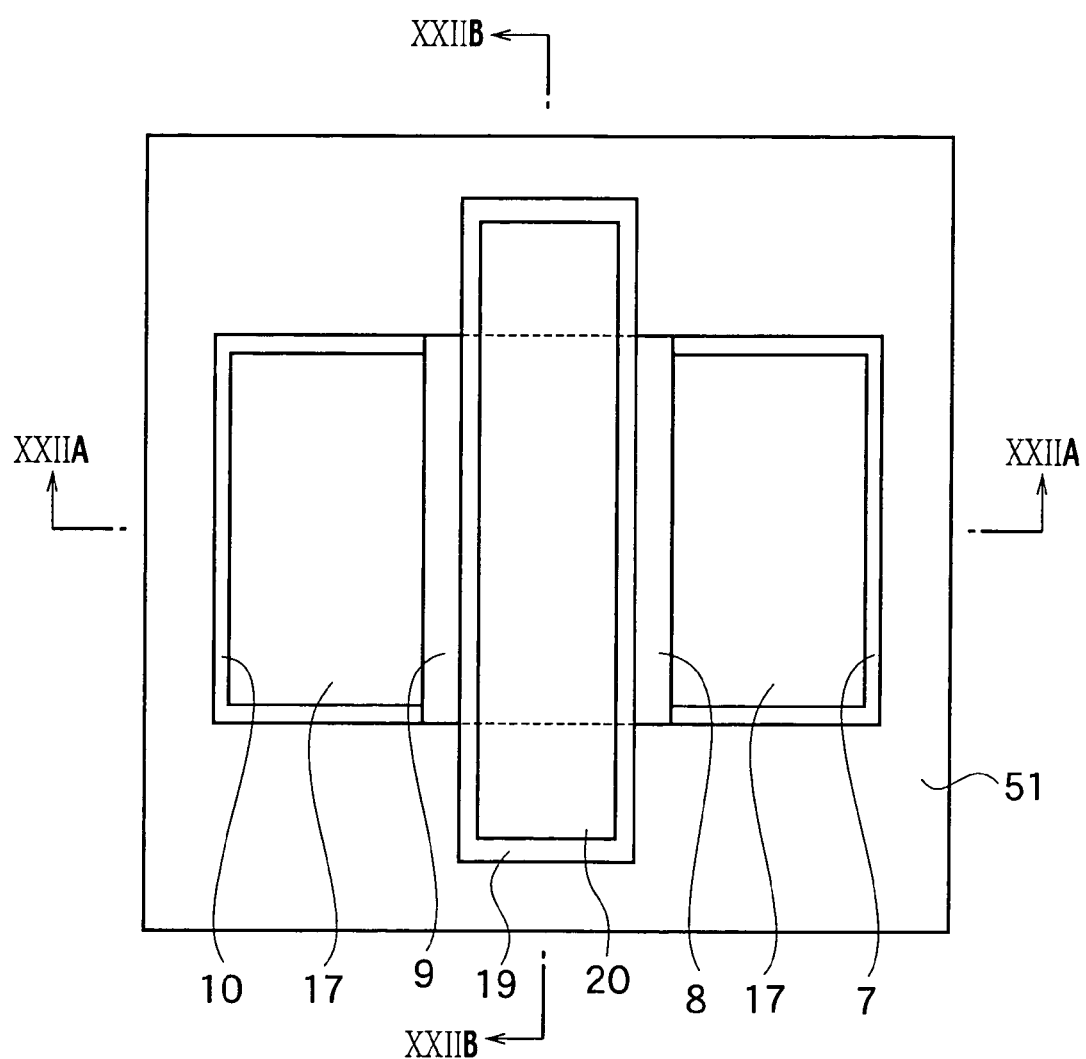

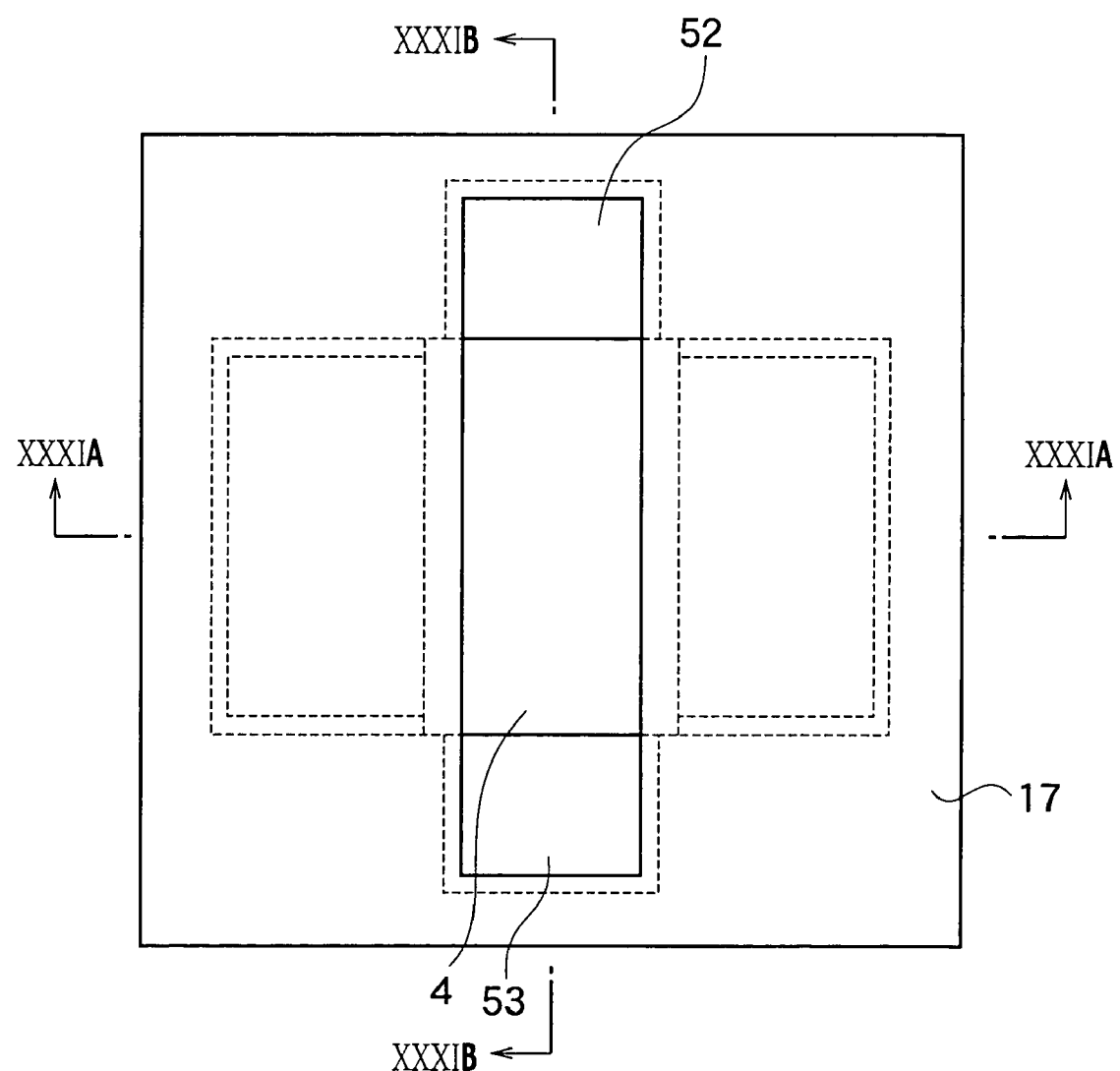

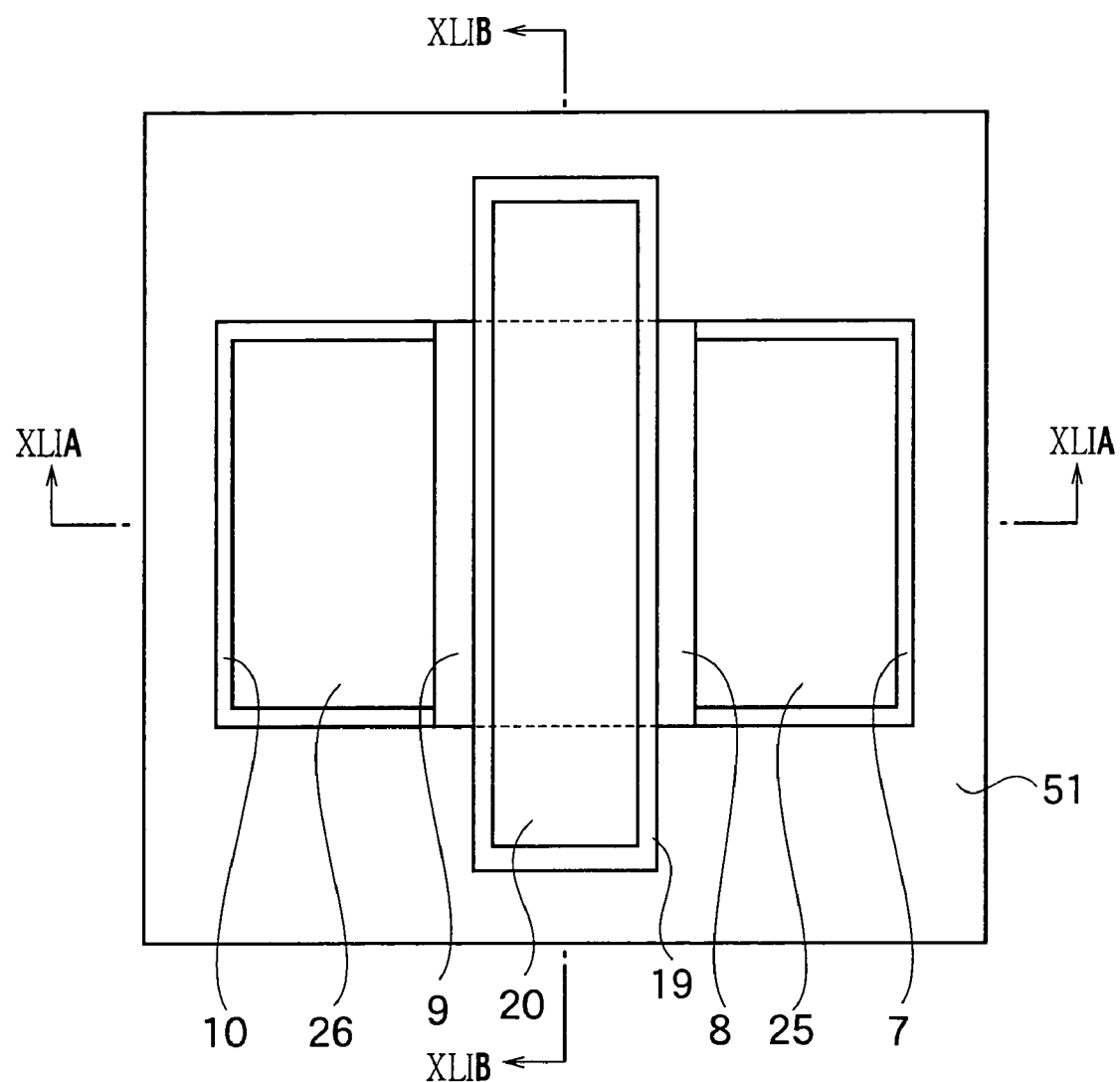

SEMICONDUCTOR DEVICE HAVING LOW RESISTIVITY SOURCE AND DRAIN ELECTRODES

CROSS REFERENCE TO RELATED APPLICATIONS

This application is based upon and claims the benefit of priority from the prior Japanese Patent Application No. P2002-312994, filed on Oct. 28, 2002; the entire contents of which are incorporated herein by reference.

BACKGROUND OF THE INVENTION

1. Field of the Invention

The present invention relates to a transistor having a metal gate electrode formed by using a damascene gate process. In particular, the present invention relates to source and drain electrodes having a low resistance there between.

2. Description of the Related Art

A transistor having a metal gate electrode can be fabricated by using a damascene gate process. Also, a transistor having reduced resistance between source and drain electrodes respectively connected to source and drain impurity diffusion layers can be fabricated by forming nickel silicide on the source and drain impurity diffusion layers.

In the damascene gate process, the source and drain impurity diffusion layers are formed, and thereafter gate insulation film formation and annealing for activation subsequent to ion implantation to a channel portion are conducted. Each of the gate insulation film formation and annealing is a thermal process conducted at a temperature of at least 600° C. However, there is a problem in the use of nickel silicide in that agglomeration is caused by a thermal process conducted at a temperature of at least 500° C. and the resistance between the source and drain electrodes increases to an unacceptable level.

SUMMARY OF THE INVENTION

An aspect of the present invention inheres in a semiconductor device according to embodiments of the present invention which includes a semiconductor substrate including an active area having a first top surface and an isolation area having a second top surface lower than the first top surface and surrounding the active area, an isolation insulator including first insulators disposed on the second top surface, being in contact with the active area and having a third top surface higher than the first top surface, and a second insulator disposed on the second top surface, being in contact with the active area and the first insulators, and having a fourth top surface higher than the third top surface, a source side wall insulator including a first side wall disposed on the first top surface and being in contact with a side face of the second insulator, and a second side wall disposed on the first top surface and having ends respectively being in contact with ends of the first side wall, a drain side wall insulator including a third side wall disposed on the first top surface and being in contact with a side face of the second insulator, and a fourth side wall disposed on the first top surface, being parallel to the second side wall and having ends respectively in contact with ends of the third side wall, a gate insulation film disposed on the first top surface and the third top surface and in contact with side faces of the second insulator, the second side wall and the fourth side wall, a gate conductor disposed on the gate insulation film and having a side face in contact with the gate insulation film, a source conductor disposed over the first top surface, electrically connected to the first top surface, and having a side face in contact with the first side wall and the second side wall, and a drain conductor disposed over the first top surface, electrically connected to the first top surface, and having a side face in contact with the third side wall and the fourth side wall.

Another aspect of the present invention inheres in a method of manufacturing a semiconductor device according to embodiments of the present invention which includes forming an island-shaped active area in a semiconductor substrate, forming an isolation area in a peripheral portion of the active area, forming a dummy gate crossing the active area having ends in contact with the isolation area, forming a first area in the isolation area, the first area being lower than the dummy gate, forming source and drain areas in the active area except for the dummy gate, forming side walls in peripheral portions of the source and drain areas, forming source and drain impurity diffusion layers in the source and drain areas, forming a semiconductor film in a area except for a gate wiring area including the dummy gate, the semiconductor film having the same height as that of the dummy gate, oxidizing a top surface of the semiconductor film and forming a silicon oxide film, removing the dummy gate provided in the active area by using the silicon oxide film as a mask, retreating the gate wiring area provided in the isolation area and removing the silicon oxide film, by using the semiconductor film as an etching stopper, forming a gate insulation film and a gate electrode in place of the dummy gate, removing the semiconductor film and exposing the source and drain impurity diffusion layers, and forming source and drain electrodes on the source and drain impurity diffusion layers.

BRIEF DESCRIPTION OF DRAWINGS

FIG. 1 is a top view of a semiconductor device according to a first embodiment of the present invention;

FIG. 4 is a top view of a semiconductor device in the middle of manufacture;

FIG. 7 is a top view of a semiconductor device in the middle of manufacture;

FIG. 8A is a cross-sectional view of a semiconductor device in the middle of manufacture, taken in a direction VIIIA—VIIIA shown in FIG. 7;

FIG. 8B is a cross-sectional view of a semiconductor device in the middle of manufacture, taken in a direction VIIIB—VIIIB shown in FIG. 7;

FIG. 11 is a top view of a semiconductor device in the middle of manufacture;

FIG. 19 is a top view of a semiconductor device in the middle of manufacture;

FIG. 21 is a top view of a semiconductor device in the middle of manufacture;

FIG. 30 is a top view of a semiconductor device in the middle of manufacture;

FIG. 40 is a top view of a semiconductor device in the middle of manufacture;

DETAILED DESCRIPTION OF THE INVENTION

Figure 2A:
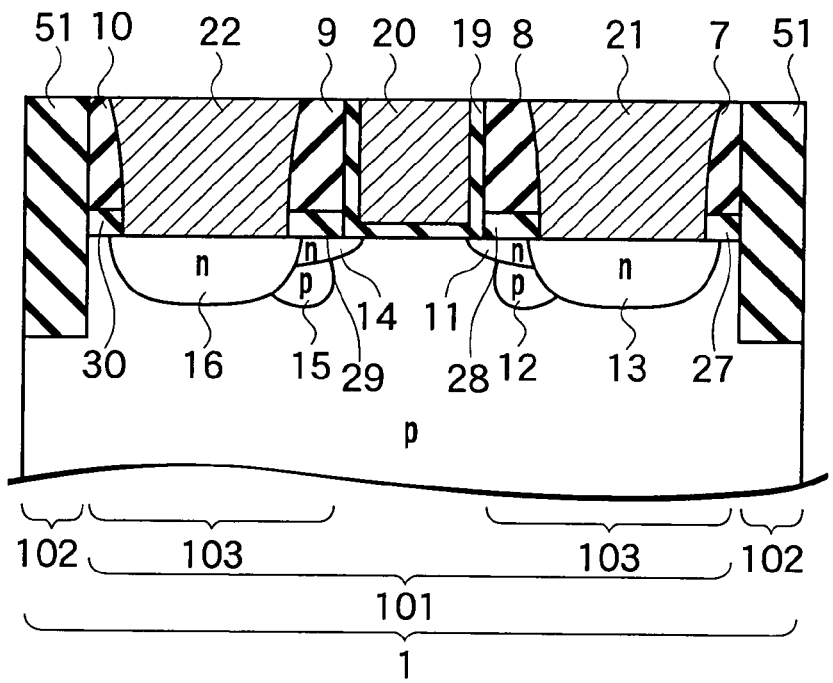
FIG. 2A is a cross-sectional view of a semiconductor device taken in a direction IIA—IIA shown in FIG. 1.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First Embodiment)

Figure 2B:
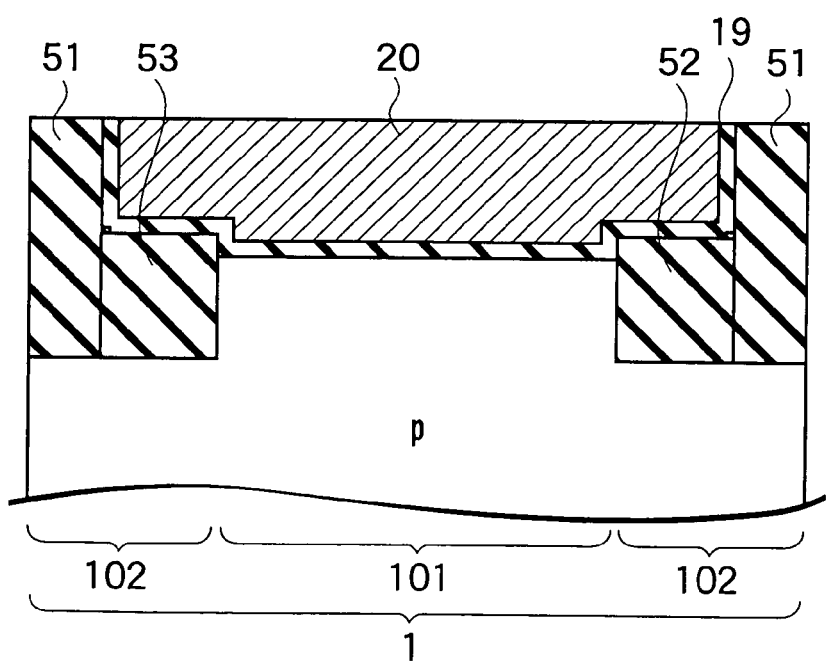
FIG. 2B is a cross-sectional view of a semiconductor device taken in a direction IIB—IIB shown in FIG. 1.

As shown in FIGS. 1, 2A and 2B, a semiconductor device according to a first embodiment of the present invention includes a semiconductor substrate or a well 1, isolation insulators 51 to 53, source side wall insulators 7, 8, 27 and 28, drain side wall insulators 9, 10, 29 and 30, a gate insulation film 19, a gate conductor 20, a source conductor 21, and a drain conductor 22.

The semiconductor substrate or the well 1 assigns an active area 101 defined by an isolation area 102. A top surface of the active area 101 is higher than a top surface of the isolation area 102. The isolation area 102 surrounds the active area 101. The active area 101 in the semiconductor substrate or the well 1, a source impurity diffusion layer 13, a drain impurity diffusion layer 16, lightly doped drain (LDD) regions 11 and 14, and halo regions 12 and 15 are merged. If the semiconductor substrate or the well 1 is p-type, then each of the halo regions 12 and 15 is p-type, and each of the source impurity diffusion layer 13, the drain impurity diffusion layer 16 and the LDD regions 11 and 14 is n-type. On the other hand, if the semiconductor substrate or the well 1 has n-type, then each of the halo regions 12 and 15 has n-type, and each of the source impurity diffusion layer 13, the drain impurity diffusion layer 16 and the LDD regions 11 and 14 is p-type.

The isolation insulators 51 to 53 are referred to as first insulators 52 and 53 and a second insulator 51. The first insulators 52 and 53 are provided on the top surface of the isolation area 102 in the semiconductor substrate 1. The first insulators 52 and 53 are in contact with a surface region of the semiconductor substrate 1 so as to define an active region 101, which corresponds to the active area 101 in the top view. Top surfaces of the first insulators 52 and 53 are higher than the top surface of the semiconductor substrate 1 at the active area 101, or the top surface of the active region 101. The second insulator 51 is provided on the top surface of the isolation area 102 in the semiconductor substrate 1. The second insulator 51 is in contact with the first insulators 52 and 53 and the semiconductor substrate 1 at the active area 101, or the active region. A top surface of the second insulator 51 is higher than the top surfaces of the first insulators 52 and 53.

The source side wall insulators 7, 8, 27 and 28 include first side wall 7 and 27 and second side wall 8 and 28. The first side wall 7 and 27 is provided on the top surface of the semiconductor substrate 1 at the active area 101. The first side wall 7 and 27 is in contact with an inner side surface of the second insulator 51. The second side wall 8 and 28 is provided on the top surface of the semiconductor substrate 1 at the active area 101. Ends of the second side wall 8 and 28 are connected to ends of the first side wall 7 and 27, respectively. The ends of the second side wall 8 and 28 are in contact with the second insulator 51. The first side wall 7 and 27 implement a two-layer structure, in which the lower layer 27 is a silicon oxide film, and the upper layer 7 is a silicon nitride film. The second side wall 8 and 28 implement a two-layer structure, in which the lower layer 28 is a silicon oxide film, and the upper layer 8 is a silicon nitride film. The LDD region 11 is provided in the active area 101 in the semiconductor substrate 1 located under the second side wall 8 and 28 at the active area 101. The halo region 12 is provided in the semiconductor substrate 1 located under the LDD region 11 at the active area 101. The LDD region 11 and the halo region 12 are provided in the semiconductor substrate 1 located under the first side wall 7 and 27 at the active area 101 as well. Since the LDD region 11 and the halo region 12 do not affect electrical characteristics of the transistor, the LDD region 11 and the halo region 12 are not illustrated.

The drain side wall insulators 9, 10, 29 and 30 include third side wall 10 and 30 and fourth side wall 9 and 29. The third side wall 10 and 30 is provided on the top surface of the semiconductor substrate 1 at the active area 101. The third side wall 10 and 30 is in contact with an inner side surface of the second insulator 51. The fourth side wall 9 and 29 is provided on the top surface of the semiconductor substrate 1 at the active area 101 so as to be parallel to the second side wall 8 and 28. Ends of the fourth side wall 9 and 29 are connected to ends of the third side wall 10 and 30, respectively. The ends of the fourth side wall 9 and 29 are in contact with the second insulator 51. The third side wall 10 and 30 implement a two-layer structure, in which the lower layer 30 is a silicon oxide film, and the upper layer 10 is a silicon nitride film. The fourth side wall 9 and 29 implement a two-layer structure, in which the lower layer 29 is a silicon oxide film, and the upper layer 9 is a silicon nitride film. Topmost portions of the first side wall 7 and 27 and the third side wall 10 and 30 are equal to or lower in height than the top surface of the second insulator 51. Topmost portions of the second side wall 8 and 28 and the fourth side wall 9 and 29 are equal in height to the top surface of the second insulator 51. The LDD region 14 is provided in the semiconductor substrate 1 located under the fourth side wall 9 and 29 at the active area 101. The halo region 15 is provided in the semiconductor substrate 1 located under the LDD region 14 at the active area 101. The LDD region and the halo region are provided in the semiconductor substrate 1 located under the third side wall 10 and 30 as well at the active area 101. Since the LDD region and the halo region do not affect electrical characteristics of the transistor, however, the LDD region and the halo region are not illustrated.

The gate insulation film 19 is provided on the top surface of the semiconductor substrate 1 at the active area 101 and on the top surfaces of the first insulators 52 and 53. The gate insulation film 19 is in contact with the second insulator 51, the second side wall 8 and 28, and the fourth side wall 9 and 29. The gate insulation film 19 has a high dielectric substance that permitivity is higher than that of silicon oxide.

The gate conductor 20 is provided on the gate insulation film 19. Side faces of the gate conductor 20 are in contact with the gate insulation film 19. Topmost portions of the gate insulation film 19 and the gate conductor 20 are equal in height to the top surface of the second insulator 51. The gate conductor 20 is formed of metal.

The source conductor 21 is provided on a top surface of the source impurity diffusion layer 13 disposed in the semiconductor substrate 1 at the active area 101. The source conductor 21 is electrically connected with the active area 101 in the semiconductor substrate 1. Side faces of the source conductor 21 are in contact with the first side wall 7 and 27 and the second side wall 8 and 28. The source impurity diffusion layer 13 is not in contact with the second insulator 51. Or, even if the source impurity diffusion layer 13 is in contact with the second insulator 51, an active impurity concentration in the source impurity diffusion layer 13 in the vicinity of the second insulator 51 is less than an average value of active impurity concentrations in the source impurity diffusion layer 13.

The drain conductor 22 is provided on a top surface of the drain impurity diffusion layer 16 in the active area 101 in the semiconductor substrate 1. The drain conductor 22 is electrically connected with the active area 101 in the semiconductor substrate 1. Side faces of the drain conductor 22 are in contact with the third side wall 10 and 30 and the fourth side wall 9 and 29. The drain impurity diffusion layer 16 is not in contact with the second insulator 51. Or, even if the drain impurity diffusion layer 16 is in contact with the second insulator 51, an active impurity concentration in the drain impurity diffusion layer 16 in the vicinity of the second insulator 51 is less than an average value of active impurity concentrations in the drain impurity diffusion layer 16.

Topmost portions of the source conductor 21 and the drain conductor 22 are equal in height to the top surface of the second insulator 51. The source conductor 21 and the drain conductor 22 are formed of metal. The source conductor 21 and the drain conductor 22 may also be formed of silicide.

If polysilicon is adopted for the gate electrode, then a depletion layer is created in a gate electrode, and an effective film thickness of the gate insulation film increases. If the gate insulation film is formed thin, then the increase of the effective film thickness cannot be disregarded, and the driving capability of the transistor is decreased. Therefore, a metal electrode is used as the gate electrode. As a result, the depletion layer in the gate electrode can be suppressed.

By using metal electrodes as the source and drain electrodes as well, the resistance between the source and drain electrodes can be reduced. As a result, the performance of the transistor, such as the driving capability, can be increased. In the case where the source impurity diffusion layer 13 and the drain impurity diffusion layer 16 are in contact with the second insulator 51, there is a possibility that a leakage current will flow between the source impurity diffusion layer 13 and the drain impurity diffusion layer 16 and the semiconductor substrate 1 located under the source impurity diffusion layer 13 and the drain impurity diffusion layer 16 via a contact face. In the semiconductor device of the first embodiment, the source impurity diffusion layer 13 and the drain impurity diffusion layer 16 are not in contact with the second insulator 51, and consequently it is difficult for a leakage current to flow between the source impurity diffusion layer 13 and the drain impurity diffusion layer 16 and the semiconductor substrate 1 located under the source impurity diffusion layer 13 and the drain impurity diffusion layer 16.

A method of manufacturing the semiconductor device according to the first embodiment of the present invention will now be described.

Figure 3A:
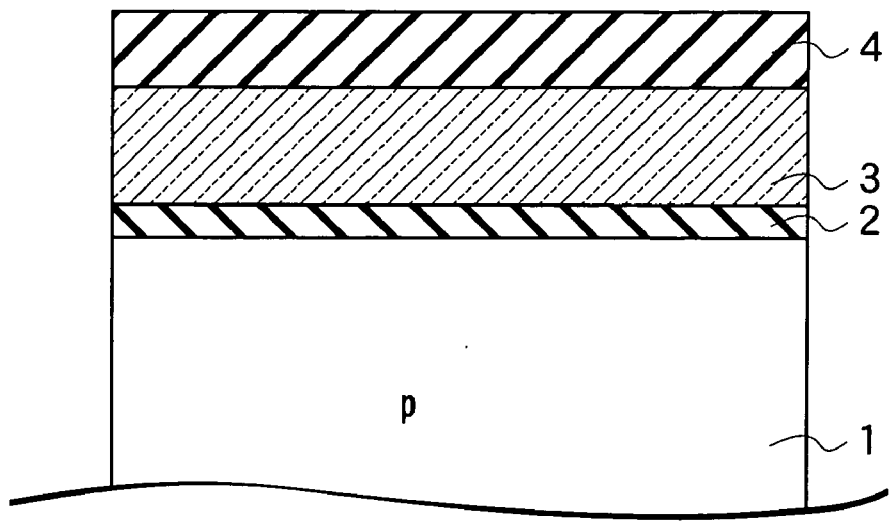
FIG. 3A is a cross-sectional view of a semiconductor device in the middle of manufacture, cut in the same direction as FIG. 2A.
Figure 3B:
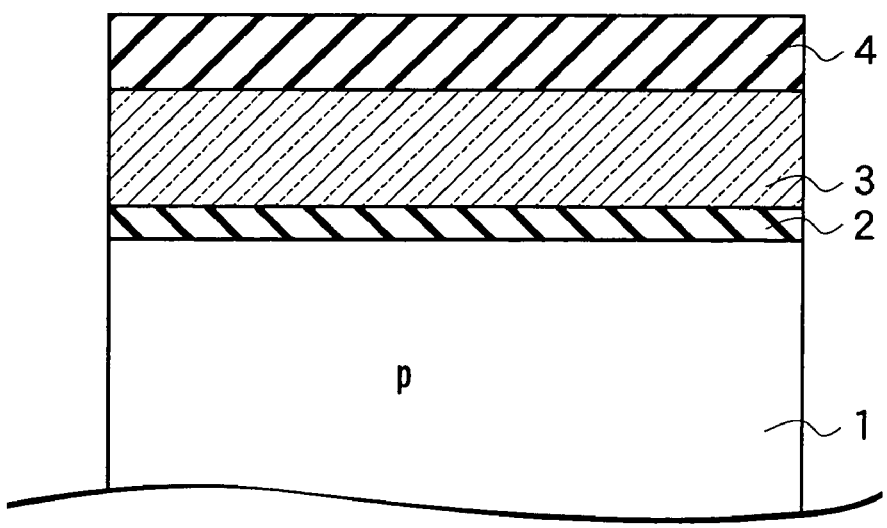
FIG. 3B is across-sectional view of a semiconductor device in the middle of manufacture, cut in the same direction as FIG. 2B.

(a) A p-type silicon (Si) substrate is prepared as the semiconductor substrate 1. Or, a p-well 1 is formed in a silicon substrate. As shown in FIGS. 3A and 3B, a silicon oxide ($SiO_2$) film serving as a buffer oxide film 2 is formed on a silicon substrate 1 by using the thermal oxidation method. Dummy polysilicon (Si) 3 and a silicon nitride ($Si_3N_4$) film 4 are formed on the buffer oxide film 2 by the chemical vapor deposition (CVD) method.

Figure 5A:
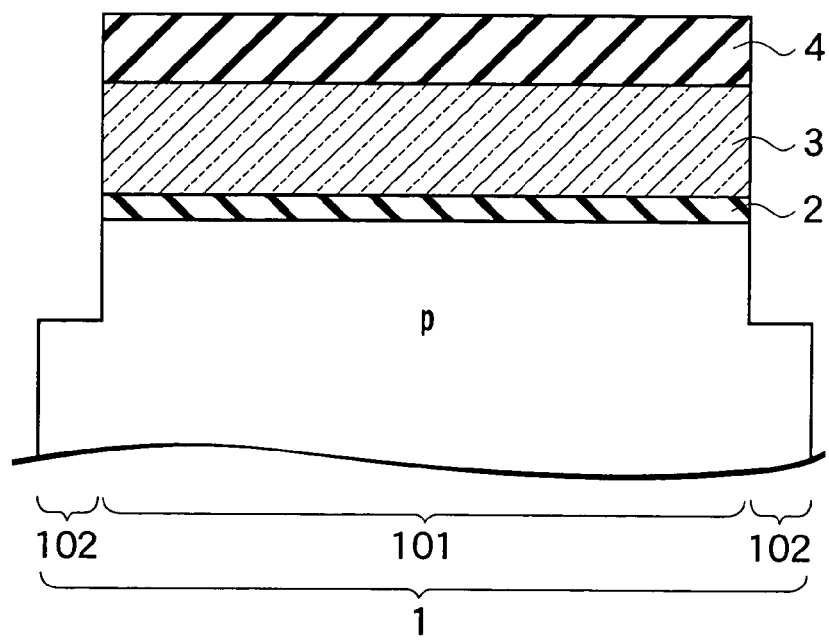
FIG. 5A is a cross-sectional view of a semiconductor device in the middle of manufacture, taken in a direction VA—VA shown in FIG. 4.
Figure 5B:
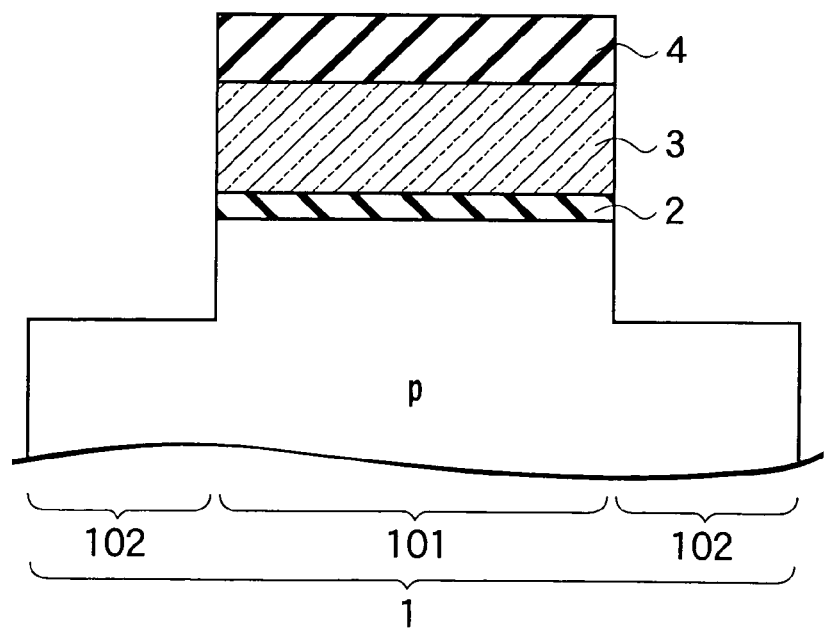
FIG. 5B is across-sectional view of a semiconductor device in the middle of manufacture, taken in a direction VB—VB shown in FIG. 4.

(b) A resist is patterned with a pattern of an active area 101. As shown in FIGS. 4, 5A and 5B, all of a silicon nitride film 4 and the polysilicon 3, and the silicon substrate 1 are anisotropically etched using reactive ion etching (RIE) to a predetermined depth. The resist is removed. As a result, an island-shaped active area 101 is formed on the semiconductor substrate 1.

Figure 6A:
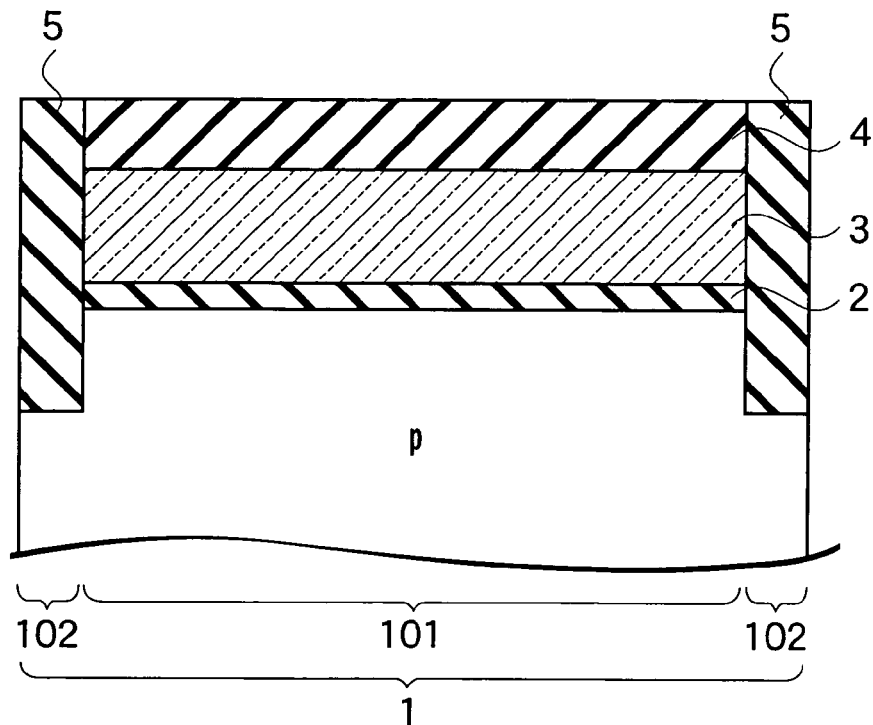
FIG. 6A is a cross-sectional view of a semiconductor device in the middle of manufacture, cut in the same direction as FIG. 5A.
Figure 6B:
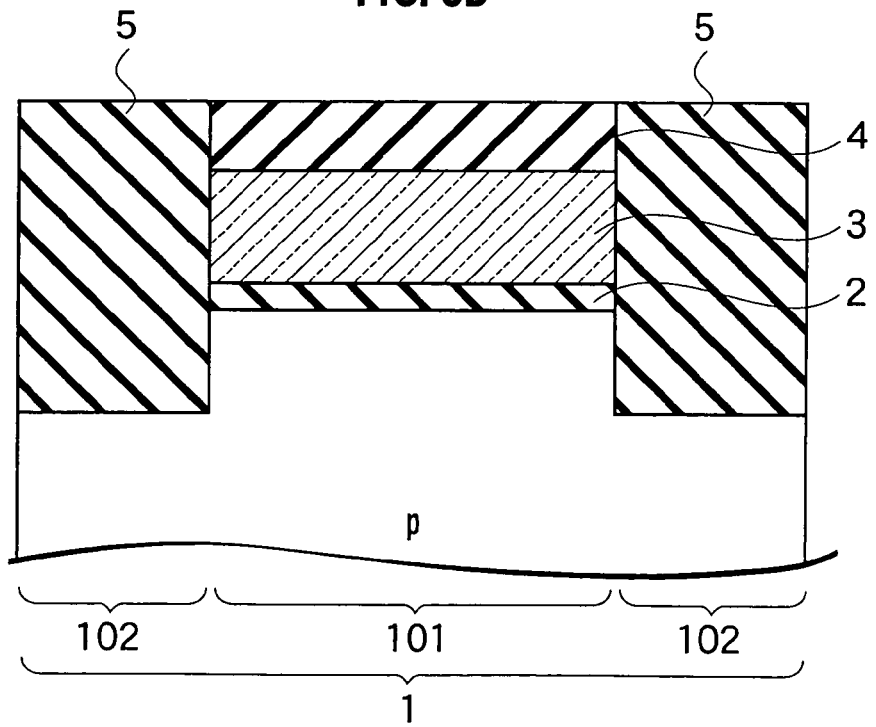
FIG. 6B is across-sectional view of a semiconductor device in the middle of manufacture, cut in the same direction as FIG. 5B.

(c) An insulation film, such as a silicon oxide film 5 is deposited on the entire wafer by using the CVD method. As shown in FIGS. 6A and 6B, the silicon oxide film 5 is polished by chemical mechanical polishing (CMP) until the top surface of the silicon nitride film 4 is exposed. The wafer surface is thus planarized. As a result, an isolation area 102 with the embedded silicon oxide film 5 is formed in a peripheral portion of the active area 101.

Figure 9A:
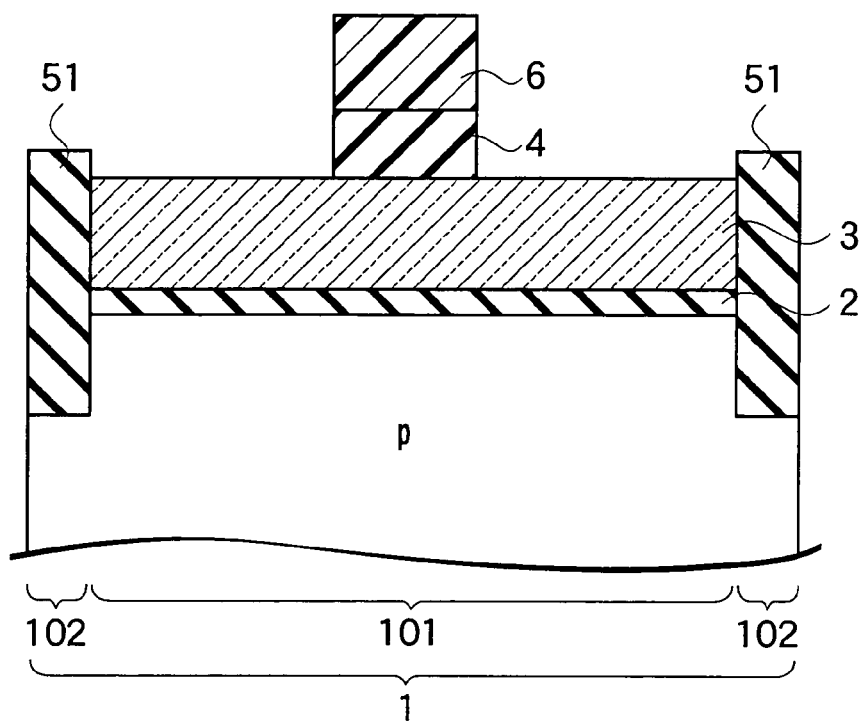
FIGS. 9A and 10A are cross-sectional views of a semiconductor device in the middle of manufacture, cut in the same direction as FIG. 8A.
Figure 9B:
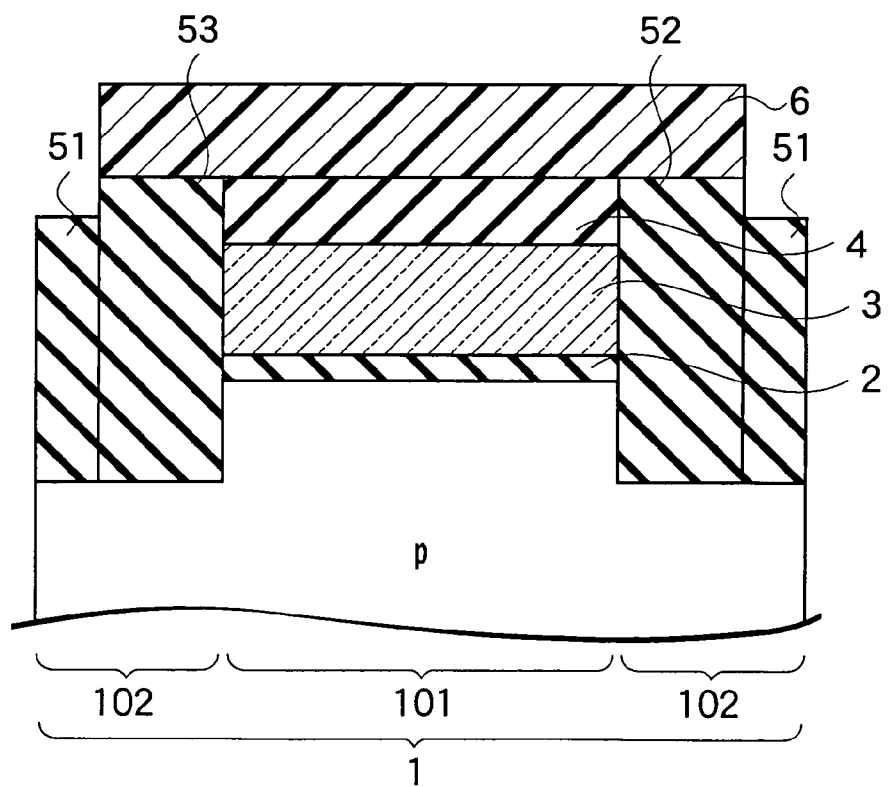
FIGS. 9B and 10B are cross-sectional views of a semiconductor device in the middle of manufacture, cut in the same direction as FIG. 8B.

(d) As shown in FIGS. 7, 8A and 8B, a resist 6 prescribing an area of a gate electrode is patterned. The resist 6 crosses the active area 101, and ends of the resist 6 are provided in the isolation area 102. As shown in FIGS. 9A and 9B, the silicon nitride film 4 is anisotropically etched using the resist 6 as a mask and the polysilicon 3 as a stopper. A silicon oxide film 51 in the isolation area 102 is anisotropically etched to a depth shallower than a film thickness of the silicon nitride film 4. Although it is desirable to anisotropically etch at the same time, the etching operations may be conducted separately.

Figure 10A:
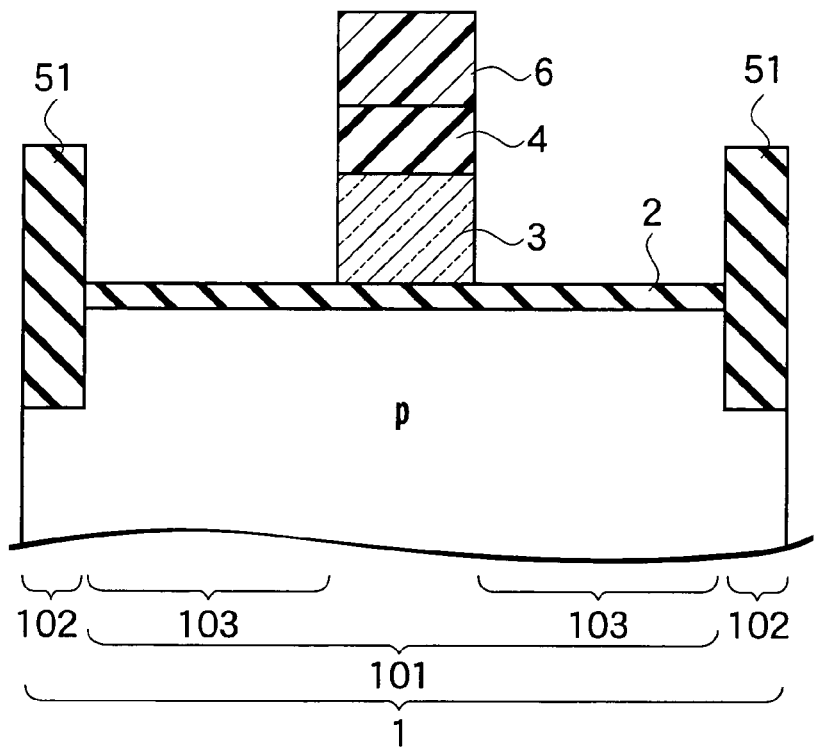
Figure 10B:
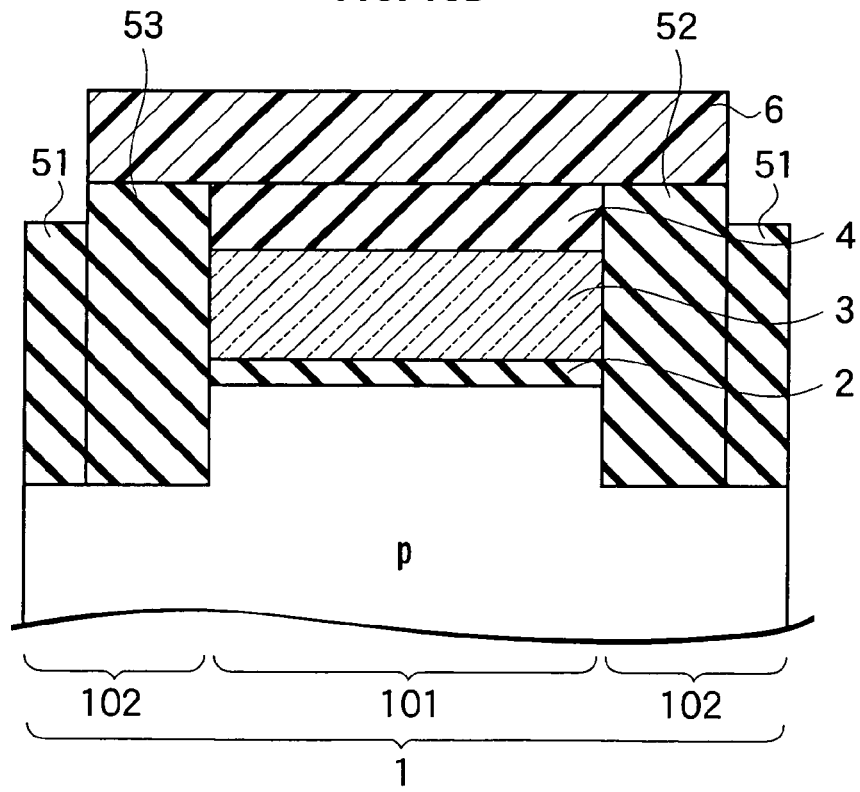

(e) As shown in FIGS. 10A and 10B, the polysilicon 3 is anisotropically etched using the resist 6 and the silicon oxide film 51 as a mask and the buffer oxide film 2 as a stopper. The resist 6 is removed. As a result, a dummy gate 3 and 4 that crosses the active area 101. The dummy gate 3 and 4 implements a two-layer structure, in which the upper layer 4 is a silicon nitride layer and the lower layer 3 is a polysilicon layer. The first area of the second insulation 51 is formed in the isolation area 102. A top surface of the first area of the second insulation 51 is lower than a top surface of the dummy gate 3 and 4. Source and drain areas 103 can be defined as the active area 101 with an area located under the dummy gate 3 and 4 excluded. A top surface of the buffer oxide film 2 located on the source and drain areas 103 is lower than the top surface of the first area of the second insulation 51.

(f) In LDD regions 11 and 14 and halo regions 12 and 15, ions are implanted at the ion implantations of the extension and the halo by using the silicon nitride film 4 in the dummy gate as a mask, i.e., so as to be self-aligned to the pattern of the gate electrode, without etching the buffer oxide film 2. Thereafter, annealing for recovery from damage is performed.

(g) A silicon nitride film is deposited on the entire surface. The silicon nitride film is etched back by using the silicon oxide films 2, 51 and 52 as a stopper and using anisotropic etching. As a result, side walls 7 to 10 are formed around the source and drain areas 103.

Figure 12A:
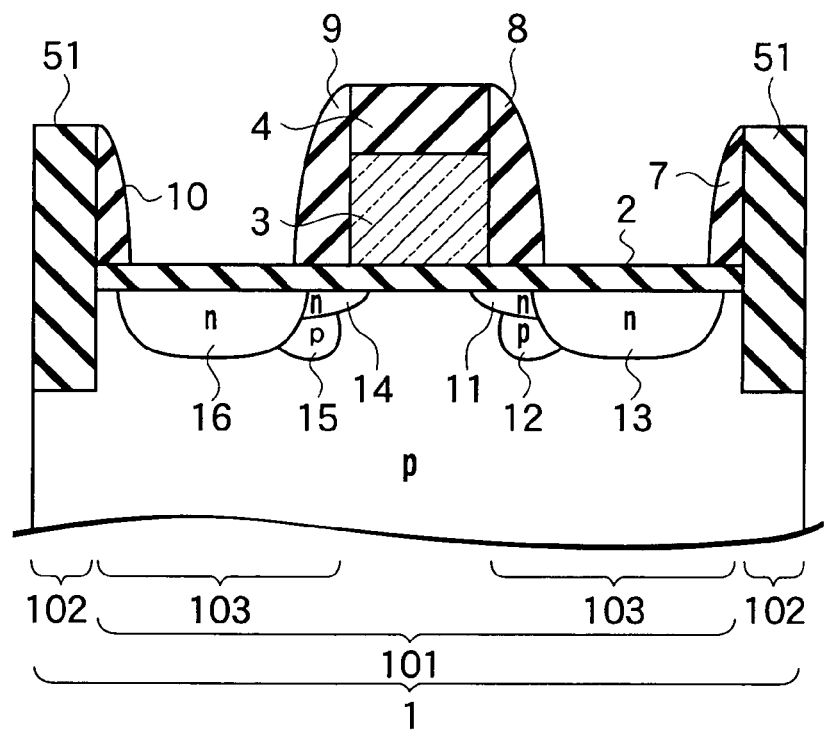
FIG. 12A is a cross-sectional view of a semiconductor device in the middle of manufacture, taken in a direction XIIA—XIIA shown in FIG. 11.
Figure 12B:
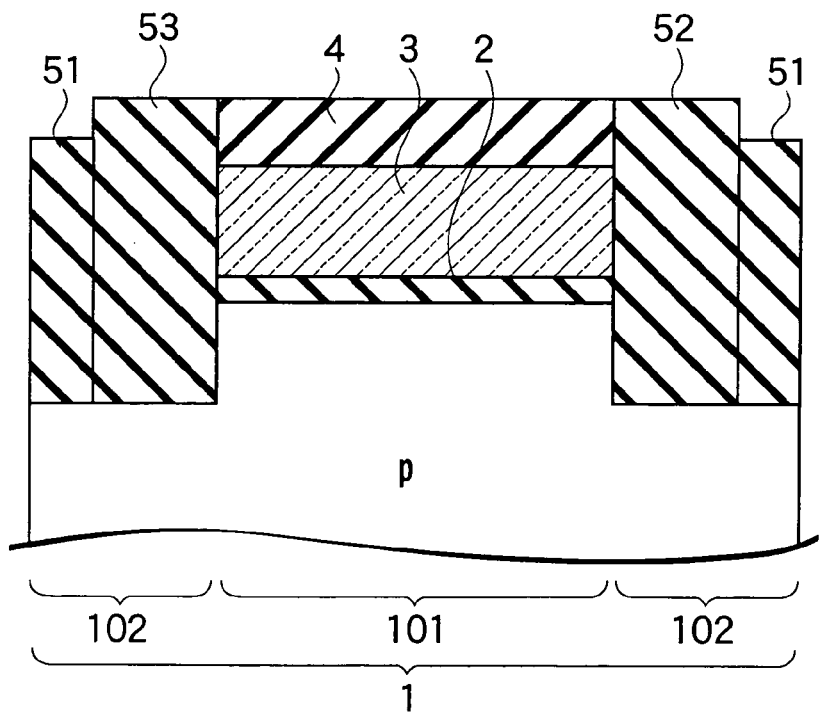
FIG. 12B is a cross-sectional view of a semiconductor device in the middle of manufacture, taken in a direction XIIB—XIIB shown in FIG. 11.

(h) As shown in FIGS. 11, 12A and 12B, ion implantation is conducted on the source impurity diffusion layer 13 and the drain impurity diffusion layer 16. Annealing is conducted in order to activate the implanted impurities and to recover the substrate from damage. The source impurity diffusion layer 13 and the drain impurity diffusion layer 16 are formed in the semiconductor substrate 1 at the source and drain areas 103. In the case where ion implantation for the channel portion in the semiconductor substrate 1 is conducted on an opening of a gate trench after the dummy gates has been removed, annealing operations for the activation can be conducted collectively after the ion implantation on the channel portion. Since the number of times of annealing can be reduced, the spread of the source impurity diffusion layer 13 and the drain impurity diffusion layer 16 can be confined to a minimum. The manufacturing method is advantageous for the formation of a transistor that is required to be minute in the source impurity diffusion layer 13 and the drain impurity diffusion layer 16.

(i) A polysilicon film 17 serving as dummy source and drain electrodes is deposited over the entire wafer surface by the CVD method. The polysilicon film 17 may be any semiconductor film as long as a thermal oxide film can be formed. The polysilicon film 17 may be, for example, silicon germanium (SiGe).

Figure 13:
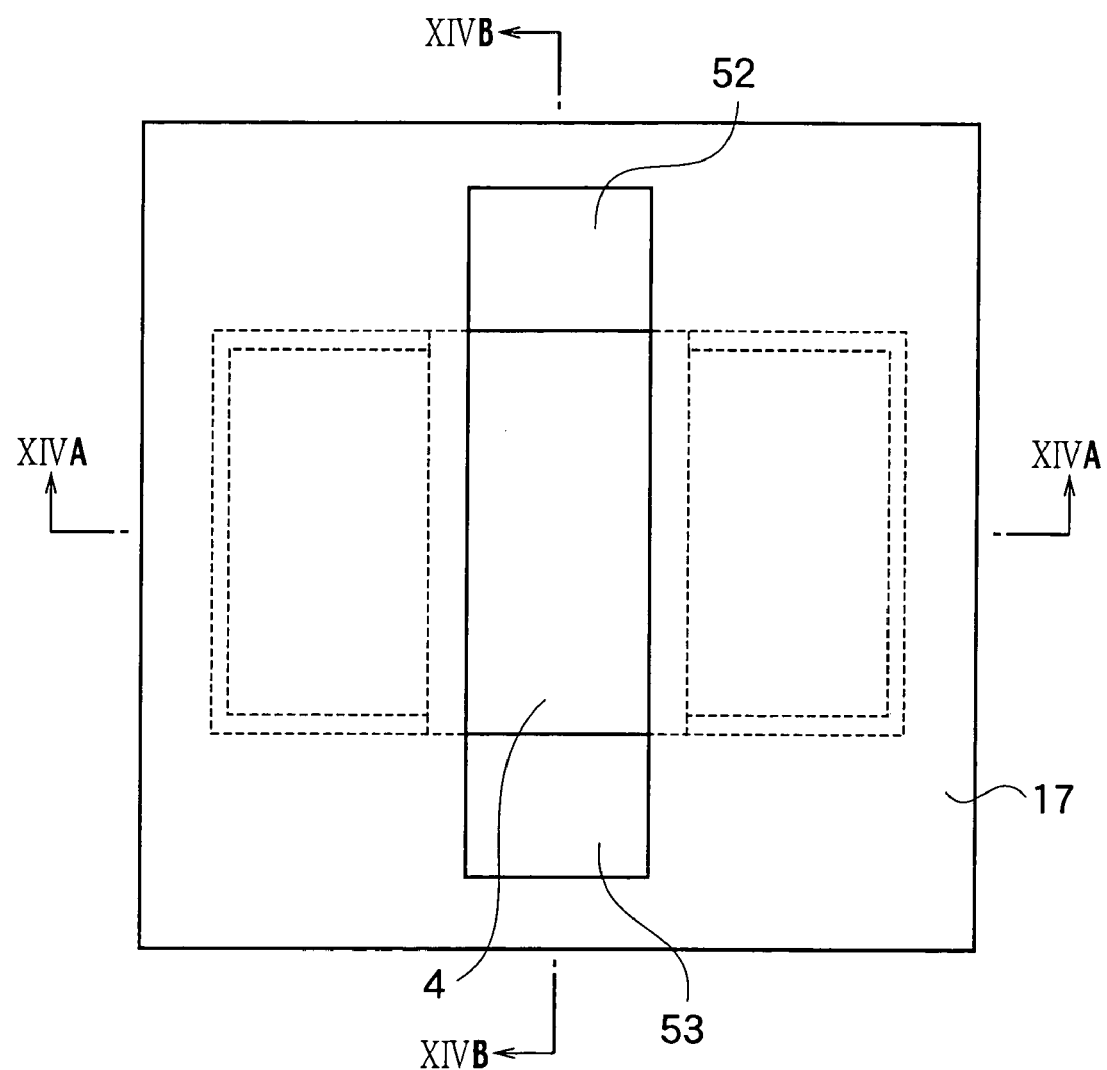
FIG. 13 is a top view of a semiconductor device in the middle of manufacture.
Figure 14A:
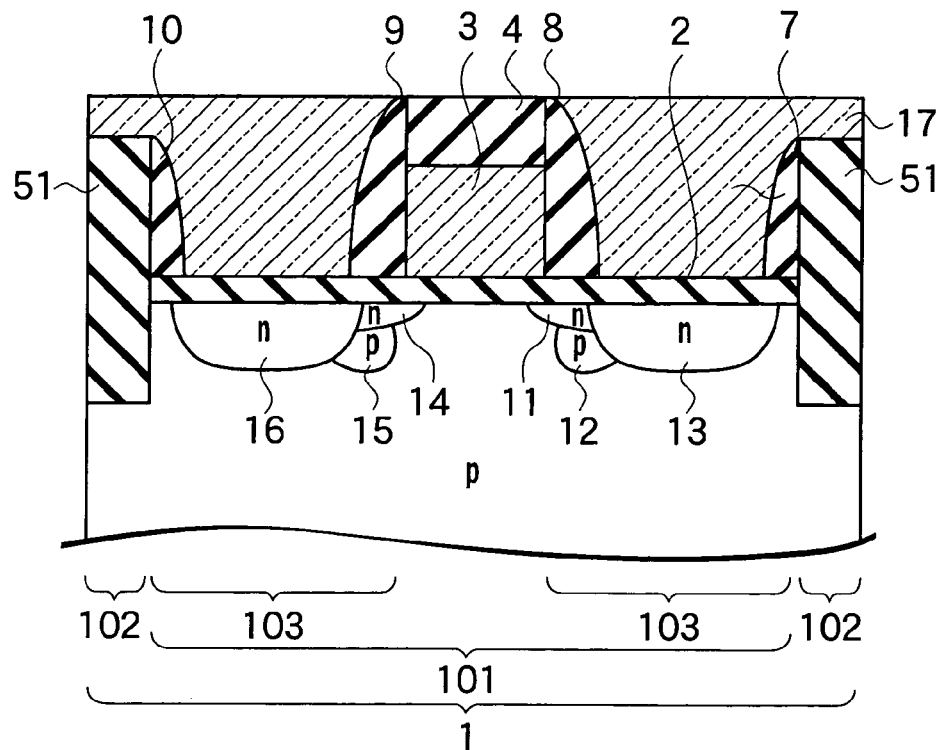
FIG. 14A is a cross-sectional view of a semiconductor device in the middle of manufacture, taken in a direction XIVA—XIVA shown in FIG. 13.
Figure 14B:
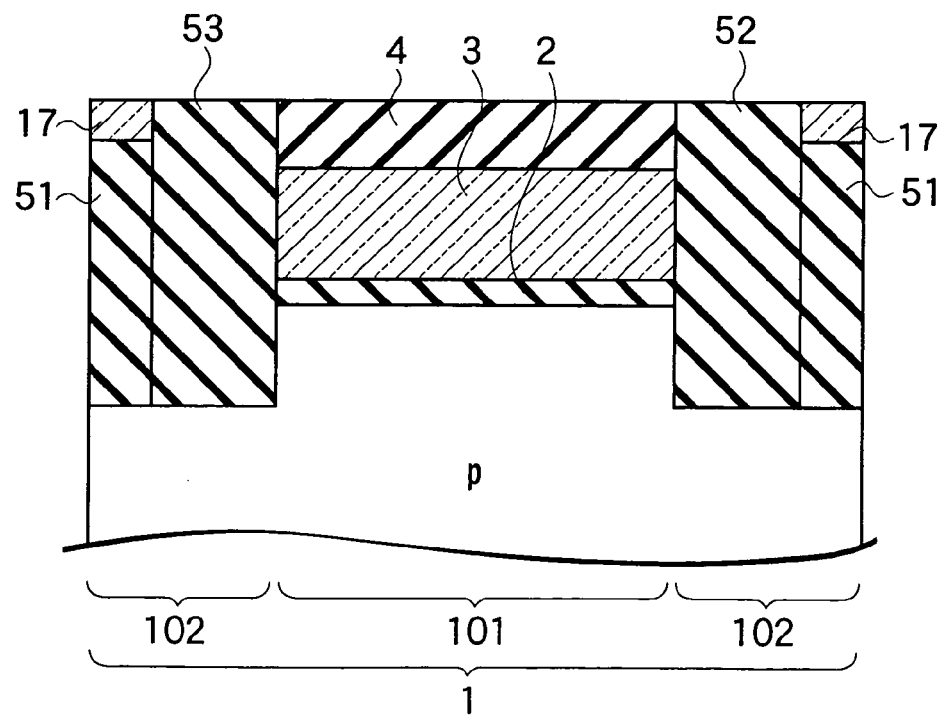
FIG. 14B is a cross-sectional view of a semiconductor device in the middle of manufacture, taken in a direction XIVB—XIVB shown in FIG. 13.

(j) The polysilicon film 17 is polished up to the top surface of the silicon nitride film 4 of the dummy gate by using the CMP method, and thereby the wafer is planarized. As shown in FIGS. 13, 14A and 14B, the polysilicon 17 is embedded in regions other than the gate patterns 4, 52 and 53, and exposed. A semiconductor film 17 having the same height as the dummy gate 3 and 4 is formed in regions other than the gate patterns 4, 52 and 53.

Figure 15A:
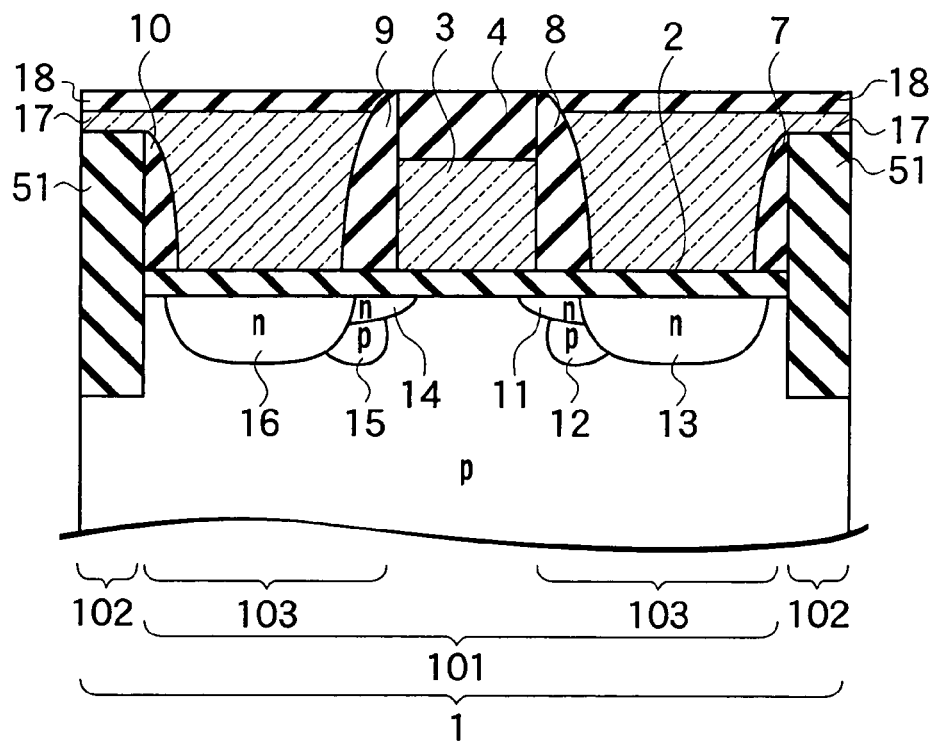
FIG. 15A is a cross-sectional view of a semiconductor device in the middle of manufacture, cut in the same direction as FIG. 14A.
Figure 15B:
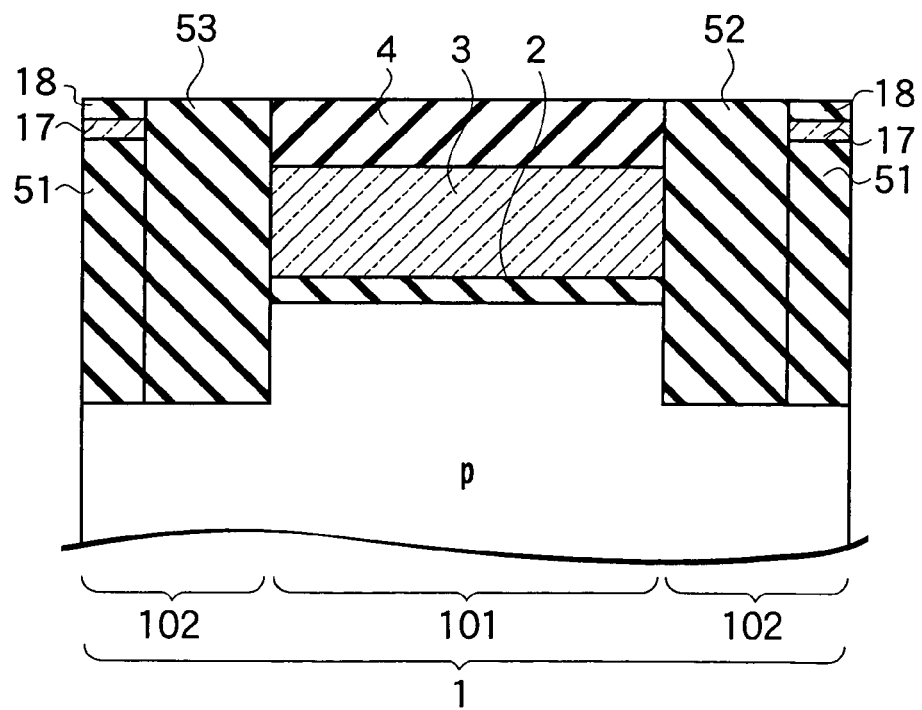
FIG. 15B is a cross-sectional view of a semiconductor device in the middle of manufacture, cut in the same direction as FIG. 14B.

(k) As shown in FIGS. 15A and 15B, a top surface of the polysilicon film 17 is subject to thermal oxidation to form a silicon oxide film 18. As a result, a region corresponding to a channel of the transistor, other than the silicon nitride film 4 of the dummy gate 3 and 4 and the side walls 8 and 9 of the silicon nitride film is covered by the silicon oxide films 18, 52 and 53.

Figure 16:
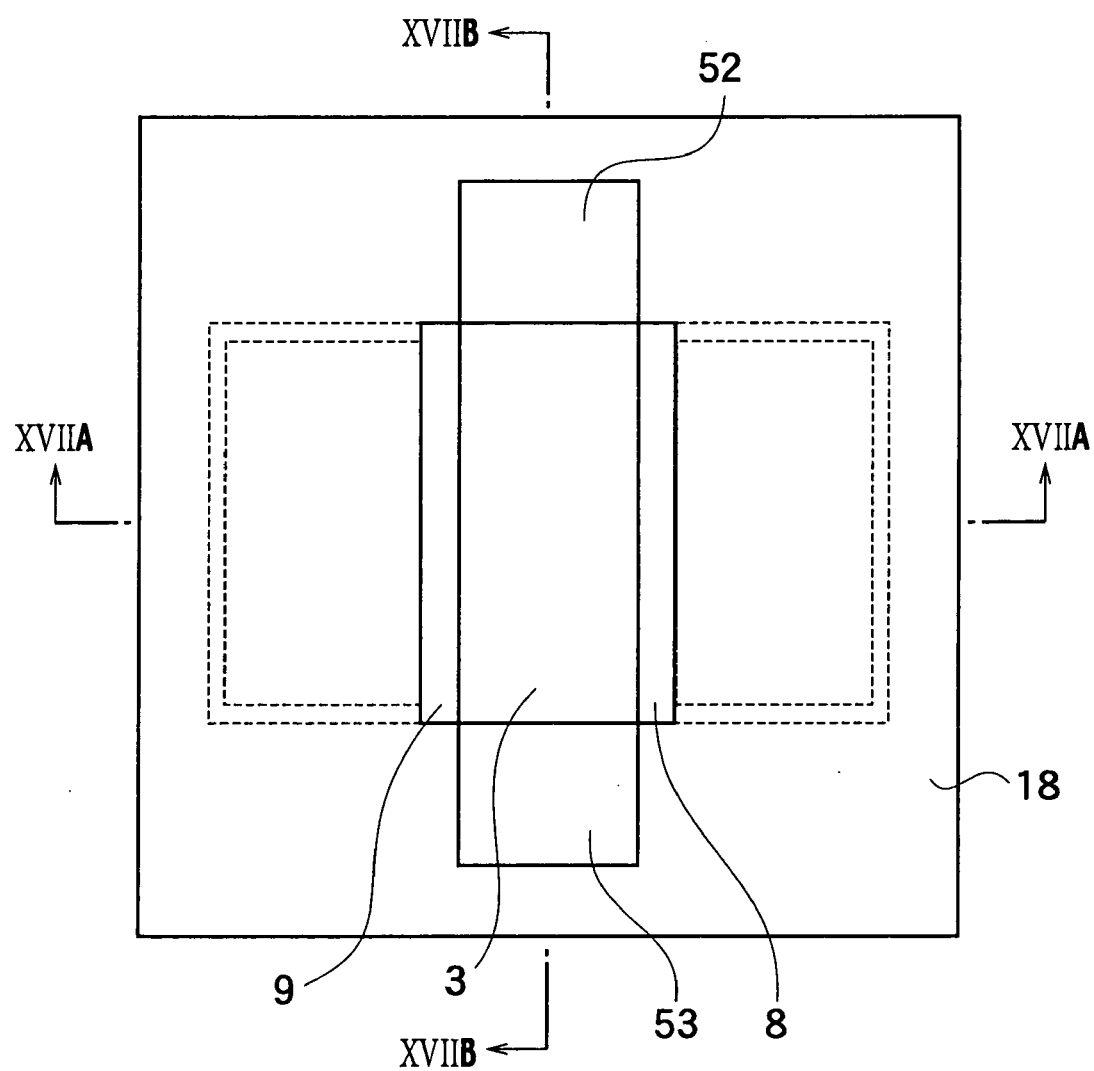
FIG. 16 is a top view of a semiconductor device in the middle of manufacture.
Figure 17A:
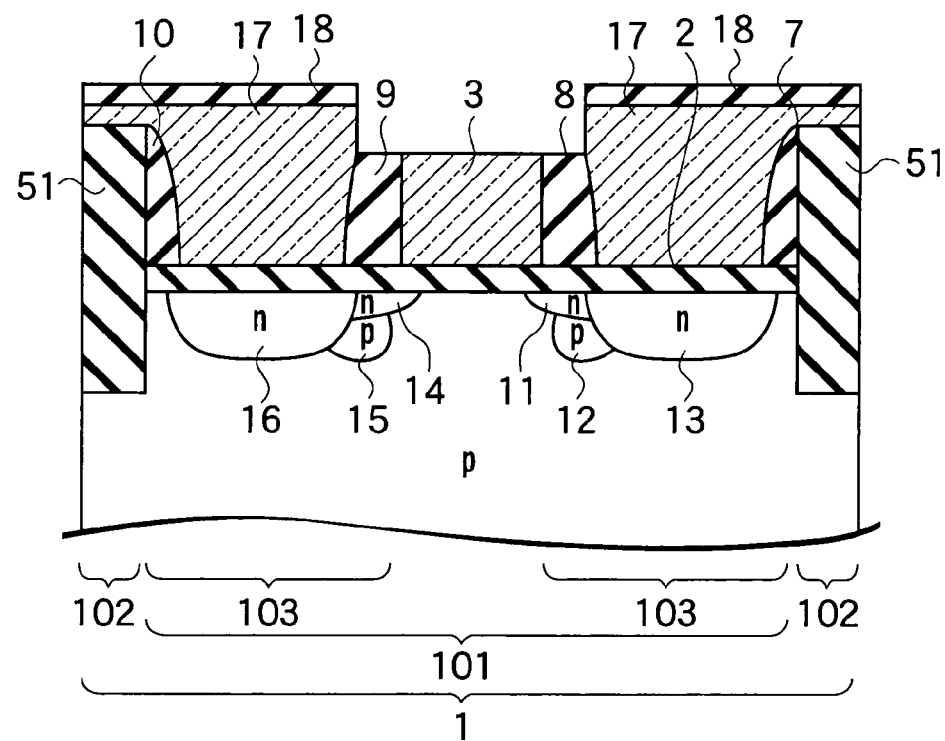
FIG. 17A is a cross-sectional view of a semiconductor device in the middle of manufacture, taken in a direction XVIIA—XVIIA shown in FIG. 16.
Figure 17B:
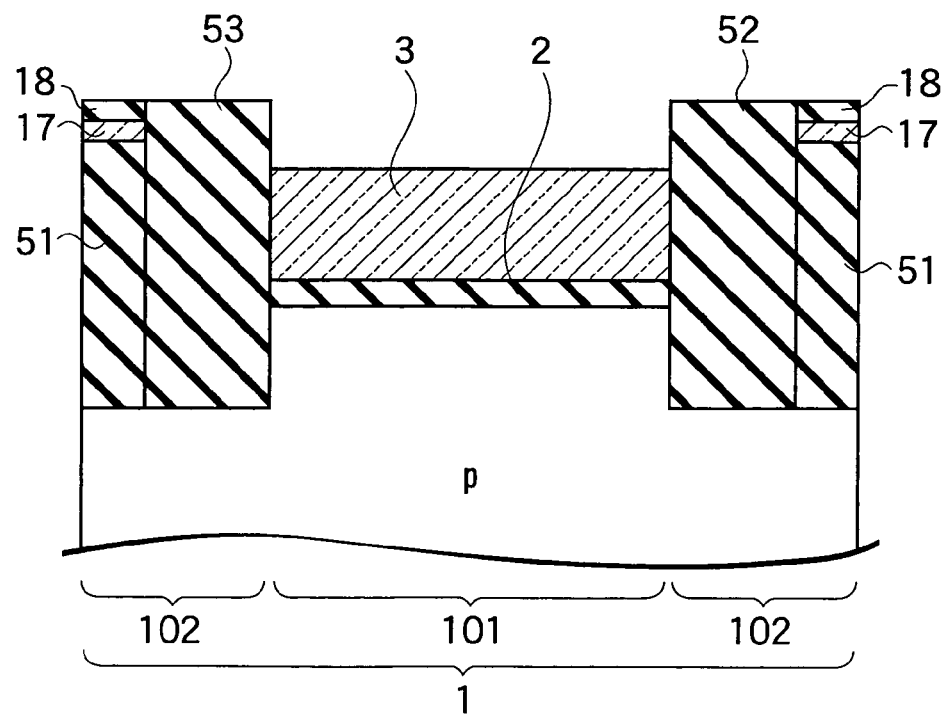
FIG. 17B is a cross-sectional view of a semiconductor device in the middle of manufacture, taken in a direction XVIIB—XVIIB shown in FIG. 16.

(l) As shown in FIGS. 16, 17A and 17B, the exposed silicon nitride film 4 is etched by using the silicon oxide films 18, 52 and 53 as a mask. Furthermore, top parts of the side walls 8 and 9 are etched.

Figure 18A:
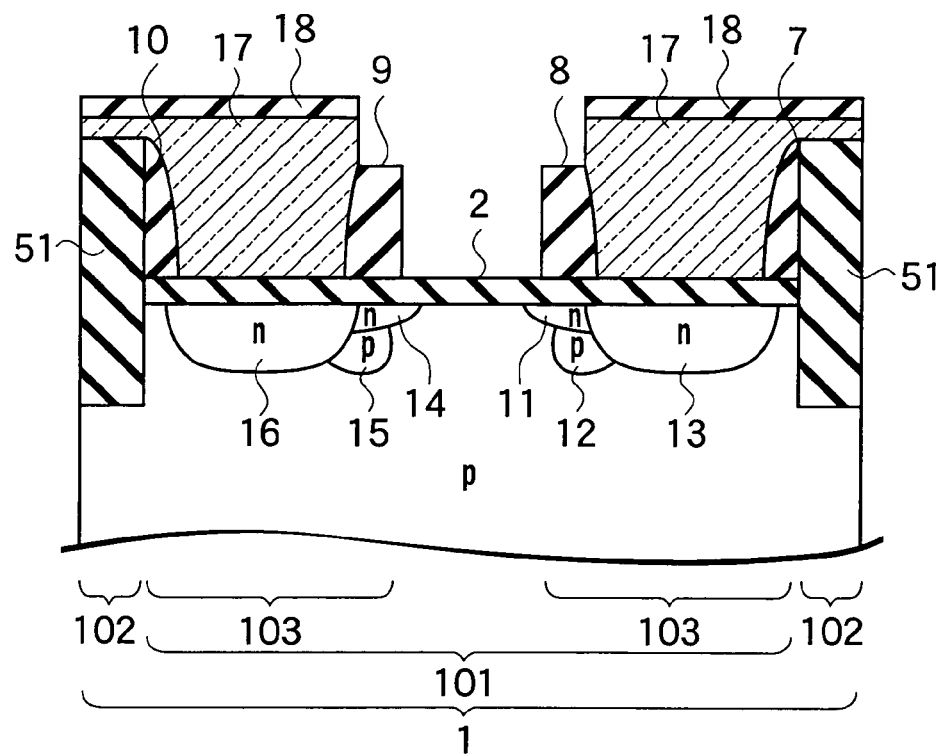
FIG. 18A is a cross-sectional view of a semiconductor device in the middle of manufacture, cut in the same direction as FIG. 17A.
Figure 18B:
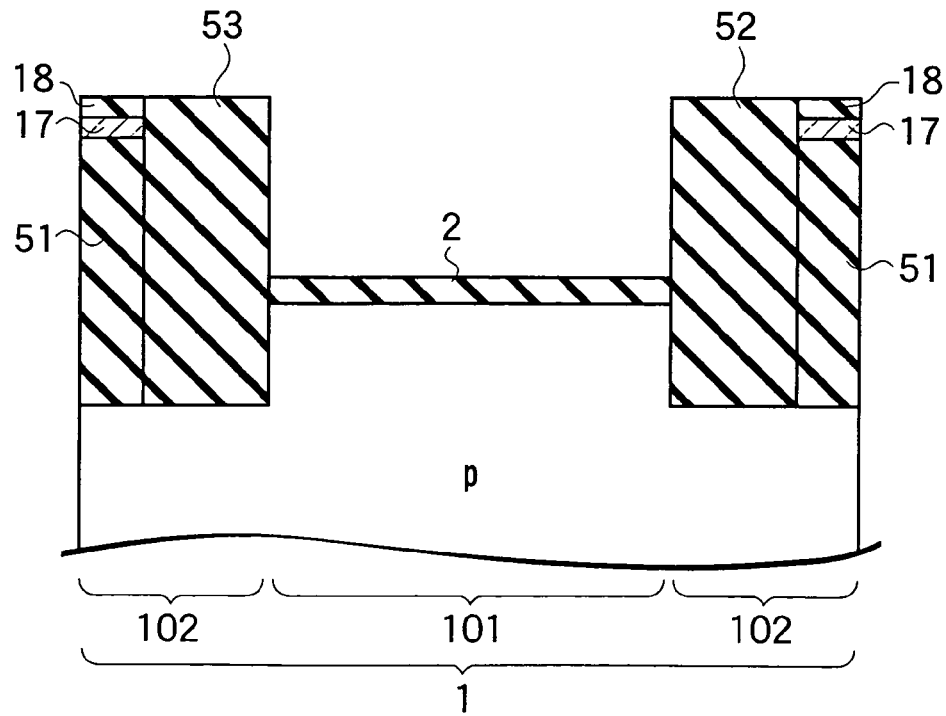
FIG. 18B is a cross-sectional view of a semiconductor device in the middle of manufacture, cut in the same direction as FIG. 17B.

(m) As shown in FIGS. 18A and 18B, polysilicon 3 of the dummy gate is etched by using the silicon oxide films 18, 52 and 53 as a mask and using the buffer oxide film 2 as a stopper.

Figure 20A:
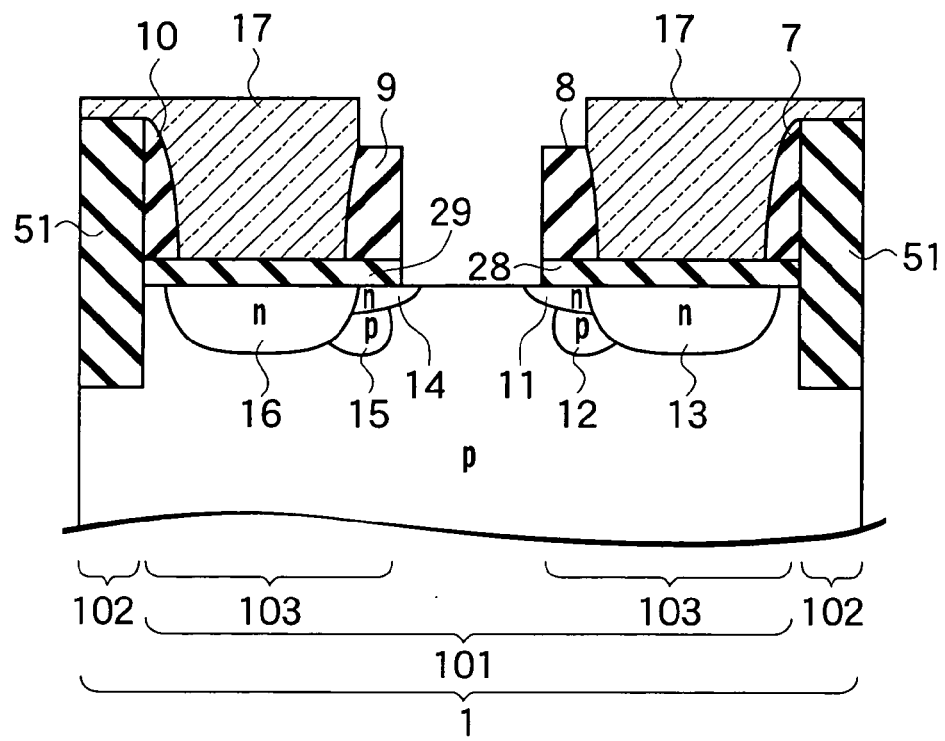
FIG. 20A is a cross-sectional view of a semiconductor device in the middle of manufacture, taken in a direction XXA—XXA shown in FIG. 19.
Figure 20B:
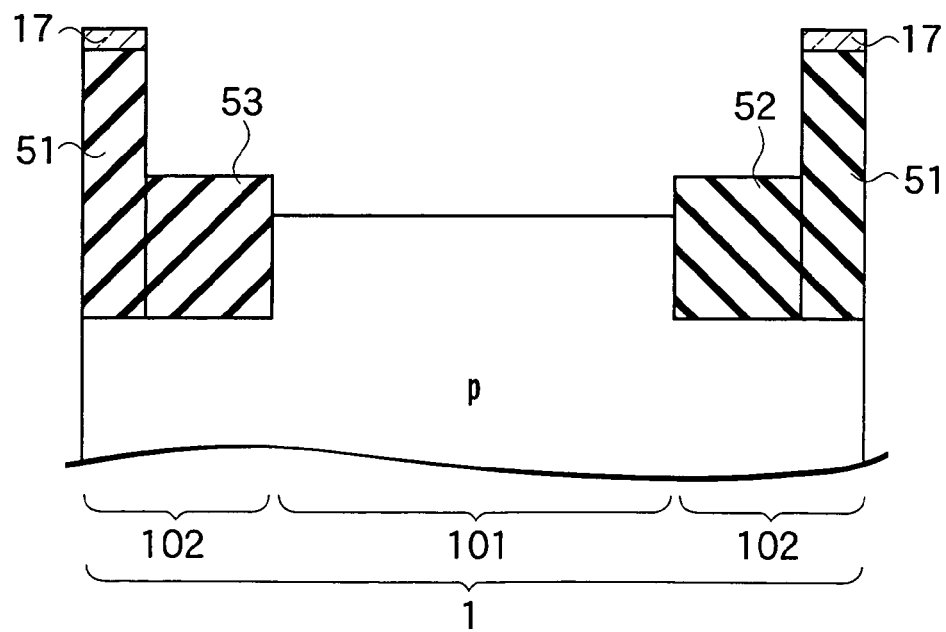
FIG. 20B is a cross-sectional view of a semiconductor device in the middle of manufacture, taken in a direction XXB—XXB shown in FIG. 19.

(n) As shown in FIGS. 19, 20A and 20B, the silicon oxide films 52 and 53 of the dummy gate pattern provided in the isolation area 102 are etched and retreated by using anisotropic etching and using the polysilicon film 17 and the semiconductor substrate 1 as an etching stopper. The silicon oxide film 18 and the buffer oxide film 2 are removed. As a result, the dummy gate 52, 53 provided in the isolation area 102 are removed, and a gate trench for embedding a gate electrode therein is formed. At this time, regions other than the gate trench are already covered by the polysilicon film 17 deposited as the dummy source and drain electrodes. The exposed silicon substrate 1 is subject to channel ion implantation as occasion demands and annealing for activating the implanted impurities.

Figure 22A:
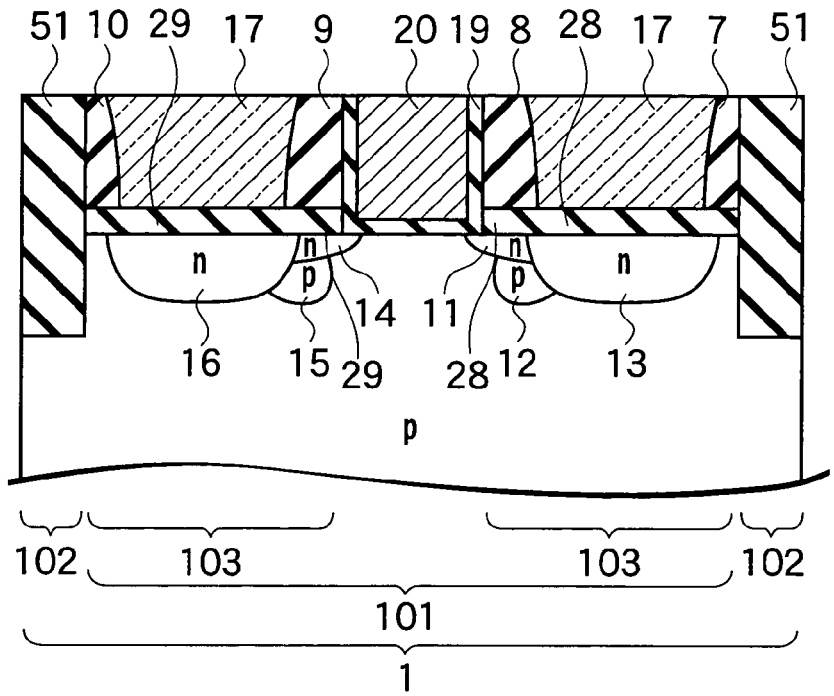
FIG. 22A is a cross-sectional view of a semiconductor device in the middle of manufacture, taken in a direction XXIIA—XXIIA shown in FIG. 21.
Figure 22B:
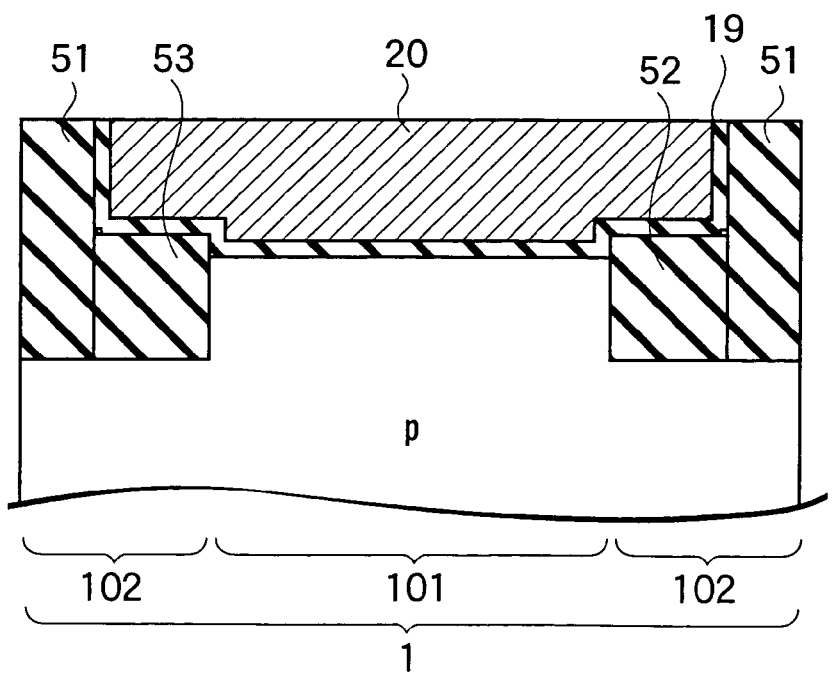
FIG. 22B is a cross-sectional view of a semiconductor device in the middle of manufacture, taken in a direction XXIIB—XXIIB shown in FIG. 16.

(o) A gate insulation film 19 is deposited. Metal serving as a gate electrode material is deposited. The metal is polished up to the top surfaces of the side walls 8 and 9 by CMP, and the wafer is planarized. As shown in FIGS. 21, 22A and 22B, therefore, the gate insulation film 19 and a gate electrode 20 are embedded in the gate trench, and gate wiring is completed. Titanium nitride (TiN), tungsten nitride (WN), tantalum nitride (TaN), tungsten (W), tantalum (Ta), molybdenum (Mo), platinum (Pt), gold (Au), or the like can be used for the gate electrode 20. However, the material of the gate electrode 20 is not always limited to the above-described materials. Silicide can be used for the gate electrode 20. As the silicide, cobalt silicide (CoSi), nickel silicide (NiSi), niobium silicide (NbSi), tantalum silicide (TaSi), tungsten silicide (WSi), platinum silicide (PtSi), molybdenum silicide (MoSi), or the like can be used. The silicide includes cobalt (Co), nickel (Ni), niobium (Nb), tantalum (Ta), tungsten (W), platinum (Pt), molybdenum (Mo), or the like. Also, the silicide may include other metal. The gate electrode 20 is not limited to a single layer, but a plurality of layers may be used, or a plurality of different kinds of metal may be mixed to cause reaction and form the gate electrode. Furthermore, a plurality of different kinds of electrodes may be formed on one wafer. It is desirable that the gate insulation film has a high dielectric substance that permitivity is higher than that of silicon oxide. The gate insulation film 19 may be a tantalum oxide (Ta2O5) film, a high dielectric substance film containing hafnium (Hf) or zirconium (Zr), a metal oxide film, a silicate film, an aluminum oxide (Al2O3) film, or a mixed film of these films.

Figure 23A:
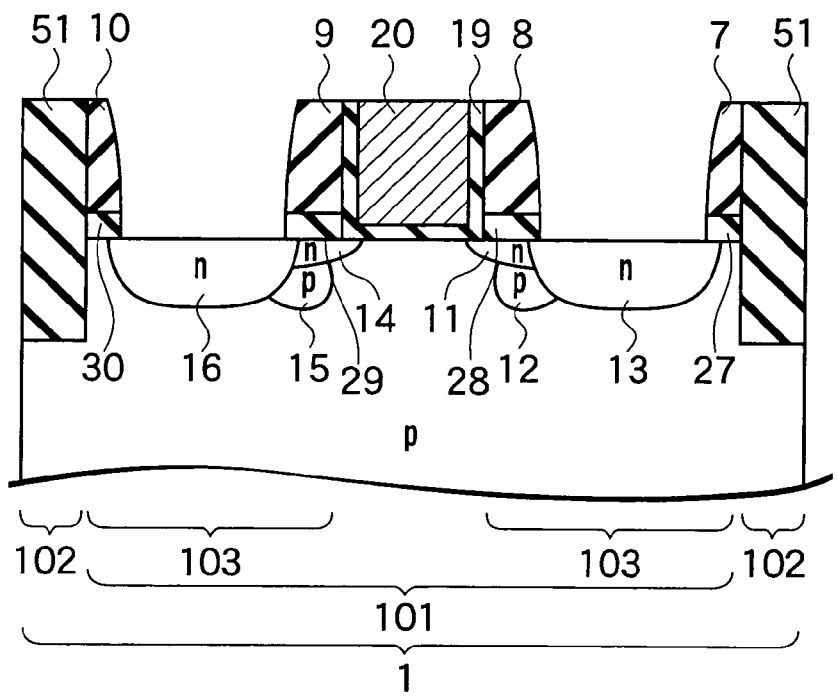
FIG. 23A is a cross-sectional view of a semiconductor device in the middle of manufacture, cut in the same direction as FIG. 22A.
Figure 23B:
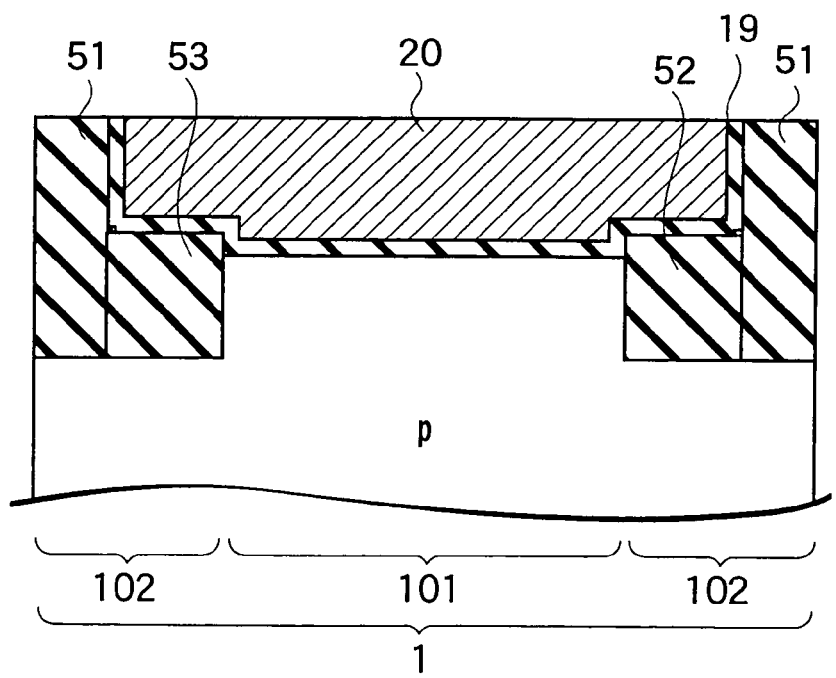
FIG. 23B is a cross-sectional view of a semiconductor device in the middle of manufacture, cut in the same direction as FIG. 22B.

(p) The polysilicon film 17 of the dummy source and drain electrodes exposed even after the planarizaion is removed by using the CDE and using the buffer oxide films 28 and 29 as a stopper. In addition, the buffer oxide films 28 and 29 are etched by using the side walls 7 to 10 as a mask and using the silicon substrate 1 as a stopper. As shown in FIGS. 23A and 23B, therefore, a top surface of the source impurity diffusion layer 13 and a top surface of the drain impurity diffusion layer 16 are exposed.

(q) Metal is deposited over the entire wafer surface inclusive of the top surface of the source impurity diffusion layer 13 and the top surface of the drain impurity diffusion layer 16. Metal deposited on top surfaces of the side walls 7 to 10 and the silicon insulation film 51 is polished and removed by CMP, and the wafer is planarized. As shown in FIGS. 1, 2A and 2B, therefore, a source electrode 21 and a drain electrode each made of metal are formed on the source impurity diffusion layer 13 and the drain impurity diffusion layer 16, respectively. The same material as that of the gate electrode can be used for the source electrode 21 and the drain electrode 22. In order to reduce the contact resistance between the silicon substrate 1 and the source electrode 21 and the drain electrode 22, silicide may be formed under the source electrode 21 and the drain electrode 22. Silicide may also be deposited on the silicon substrate. It is also possible to create a chemical reaction between the metal and the silicon substrate 1 and form silicide so as to encroach upon the silicon substrate 1. Cobalt (Co), nickel (Ni), niobium (Nb), or tantalum (Ta) can be used as metal to be reacted. The thermal process for forming silicide is not limited to a single process, and the process may be conducted a plurality of times. For example, in the case of cobalt silicide (CoSi), cobalt is first deposited, and thermal processing is conducted at a low temperature of approximately 475° C. Cobalt which is not yet reacted is removed by wet etching using a mixed solution including sulfuric acid and a hydrogen peroxide solution as the etchant. Thermal processing at a high temperature of approximately 800° C. is conducted again. In this way, in the case of cobalt, silicide reaction is conducted in twice.

(r) Subsequent methods of manufacturing the semiconductor device are the same as the methods of manufacturing a conventional semiconductor device. In other words, for example, a silicon oxide film is deposited over the entire wafer surface as an interlayer insulation film, and contact holes, which pass through the interlayer insulation film, are formed on the gate electrode 20, the source electrode 21 and the drain electrode 22. Contact electrodes respectively connected to the gate electrode 20, the source electrode 21 and the drain electrode 22 are formed in the contact holes, respectively. Finally, wiring connected to the contact electrodes is formed on the interlayer insulation film.

It should be noted that the ion implantation and annealing for well formation are conducted before forming the stacked films 3 and 4, or etching the silicon substrate 1. At this time, for alignment between a well area and the active area 101, alignment marks are previously formed by etching the silicon substrate 1 before forming the stacked films 3 and 4 of the dummy gate. As a result, alignment precision can be improved. The channel ion implantation for the threshold voltage adjustment of the transistor may also be conducted before or after the ion implantation for well formation.

According to the first embodiment, it is possible in the gate electrode 20 to decrease the gate resistance, prevent the gate depletion, and improve the drive capability of the transistor itself. In the source electrode 21 and the drain electrode 22, the on-resistance between the source and the drain can be decreased. In a semiconductor device such as an integrated circuit, therefore, the circuit resistance is suppressed and performance, such as the operation speed in an inverter circuit, is improved.

(Second Embodiment)

Figure 24:
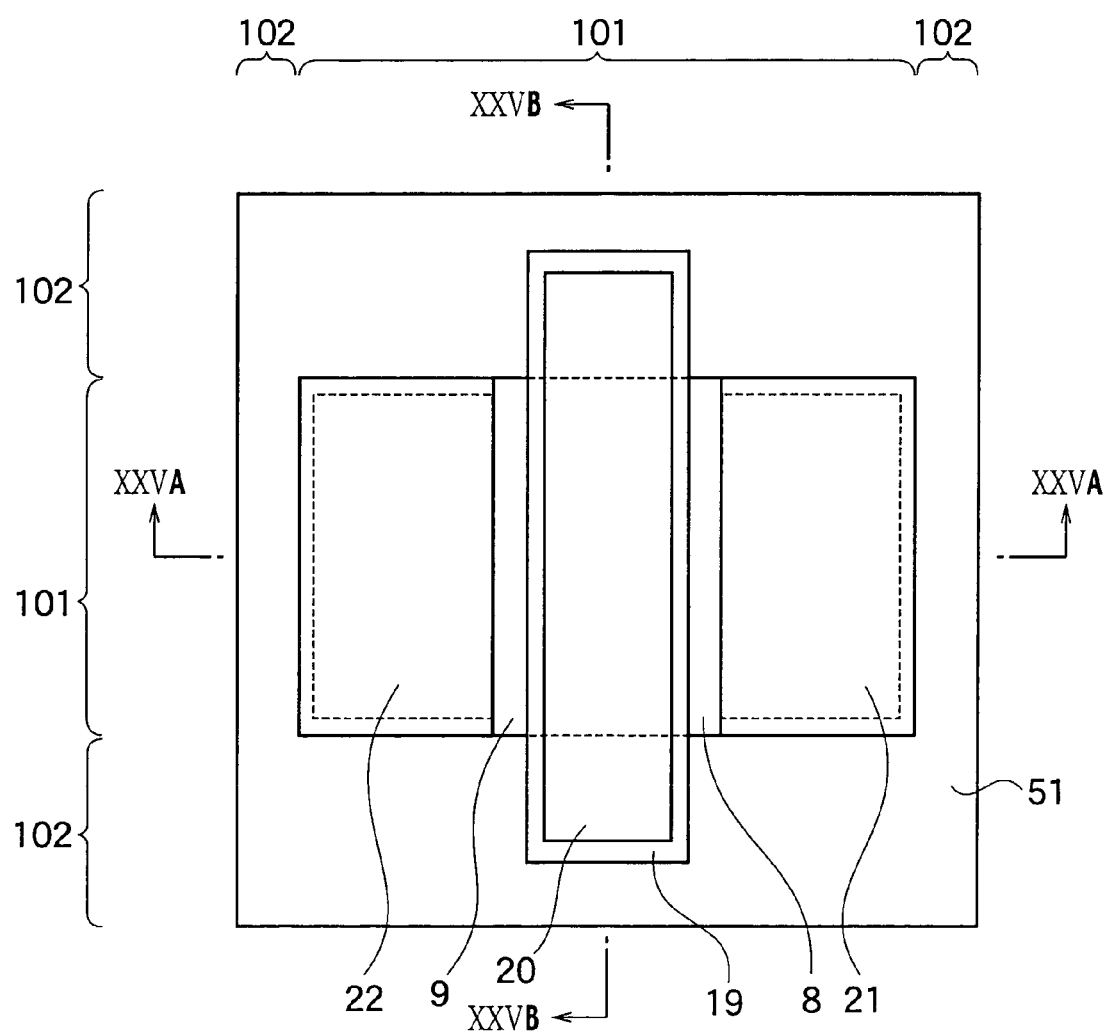
FIG. 24 is a top view of a semiconductor device according to a second embodiment of the present invention.
Figure 25A:
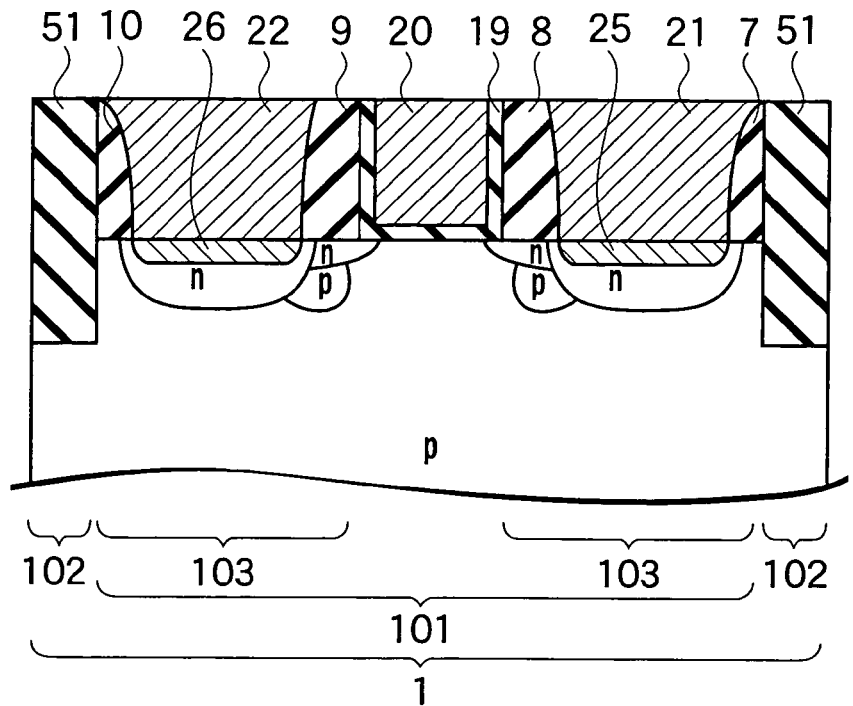
FIG. 25A is a cross-sectional view of a semiconductor device taken in a direction XXVA—XXVA shown in FIG. 24.
Figure 25B:
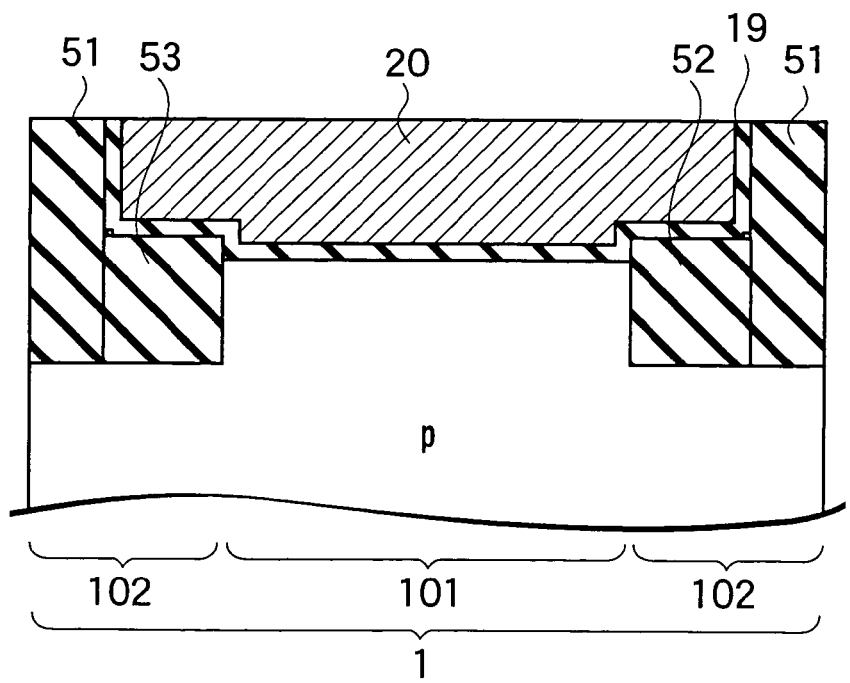
FIG. 25B is a cross-sectional view of a semiconductor device taken in a direction XXVB—XXVB shown in FIG. 24.

As shown in FIGS. 24, 25A and 25B, a semiconductor device according to a second embodiment of the present invention differs from the semiconductor device according to the first embodiment shown in FIGS. 1, 2A and 2B in the structures of the side walls 7 to 10 and the side wall peripheral structures and in that silicide layers 25 and 26 are provided.

Unlike the two-layer structure in the semiconductor device in the first embodiment, each of the side walls 7 to 10 has a single-layer structure. A height of top ends of the side walls 7 and 10 may be equal to or less than a height of the top surfaces of the silicon oxide films 51.

The silicide layers 25 and 26 are provided between the source and drain electrodes 21 and 22 and the source and drain impurity diffusion layers 13 and 16, respectively. As a result, contact resistances between the source and drain electrodes 21 and 22 and the source and drain impurity diffusion layers 13 and 16 are reduced. In addition, the silicide layers 25 and 26 are not in contact with the silicon oxide film 51. If the silicide layers 25 and 26 were in contact with the silicon oxide film 51, a leakage current might flow between the silicide layers 25 and 26 and the semiconductor substrate 1 located under the source and drain impurity diffusion layers 13 and 16 via the contact face. In the semiconductor device of the second embodiment, the silicide layers 25 and 26 are not in contact with the second insulator 51. Therefore, it is difficult for a leakage current to flow between the silicide layers 25 and 26 and the semiconductor substrate 1 located under the source and drain impurity diffusion layers 13 and 16.

A method of manufacturing the semiconductor device according to the second embodiment of the present invention will now be described.

(a) An early part of the method of manufacturing the semiconductor device in the second embodiment is the same as that shown in FIGS. 3A to 8B in the method of manufacturing the semiconductor device in the first embodiment.

Figure 26A:
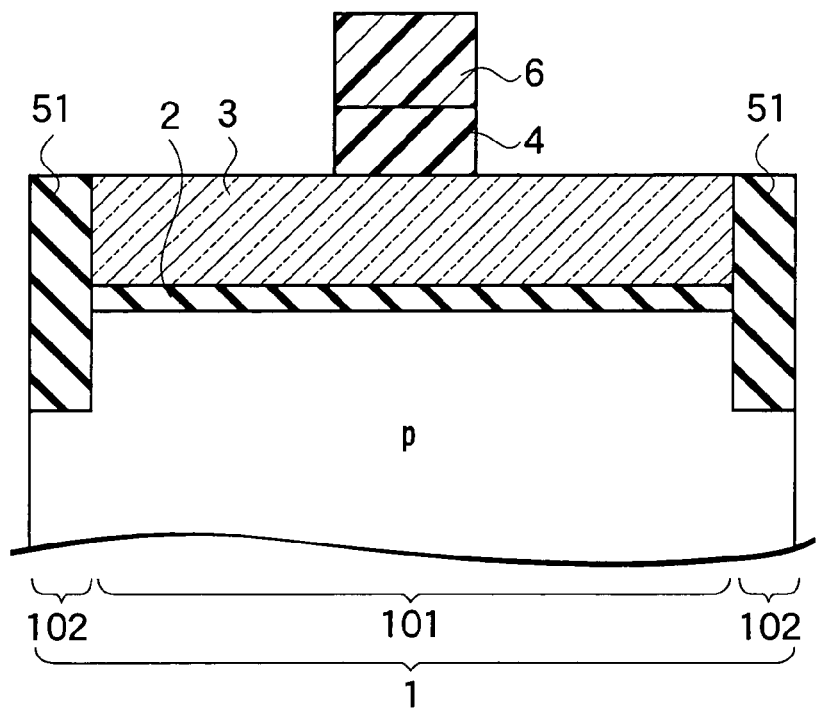
FIGS. 26A and 27A are cross-sectional views of a semiconductor device in the middle of manufacture, cut in the same direction as FIG. 25A.
Figure 26B:
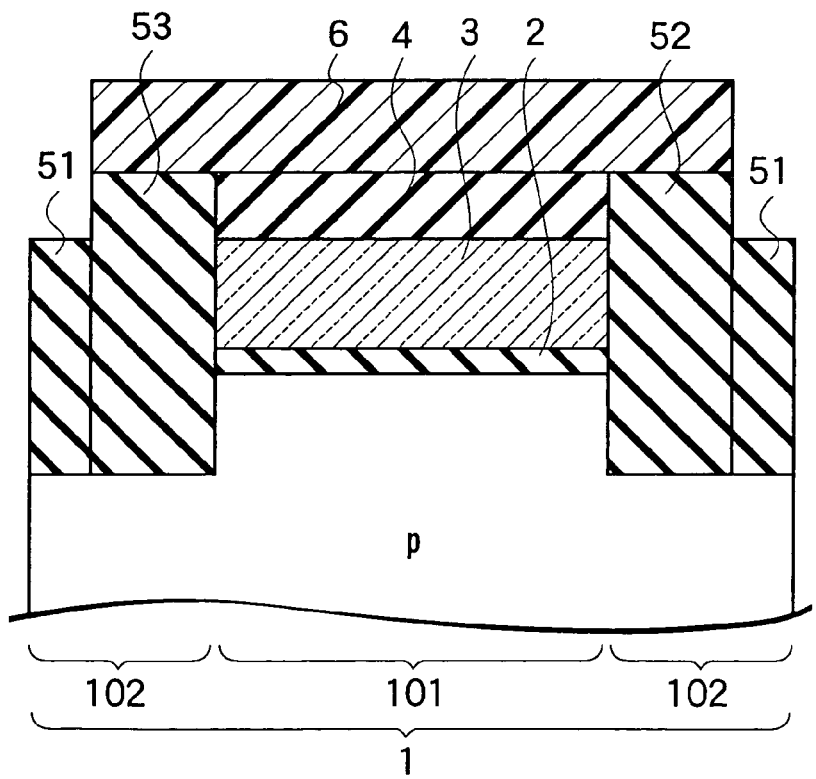
FIGS. 26B and 27B are cross-sectional views of a semiconductor device in the middle of manufacture, cut in the same direction as FIG. 25B.

(b) Subsequently, as shown in FIGS. 26A and 26B, the silicon nitride film 4 is anisotropically etched by using the resist 6 as a mask and the polysilicon 3 as a stopper. By the anisotropic etching, the silicon oxide film 51 is anisotropically etched to a depth equal to or greater than the film thickness of the silicon nitride film 4.

Figure 27A:
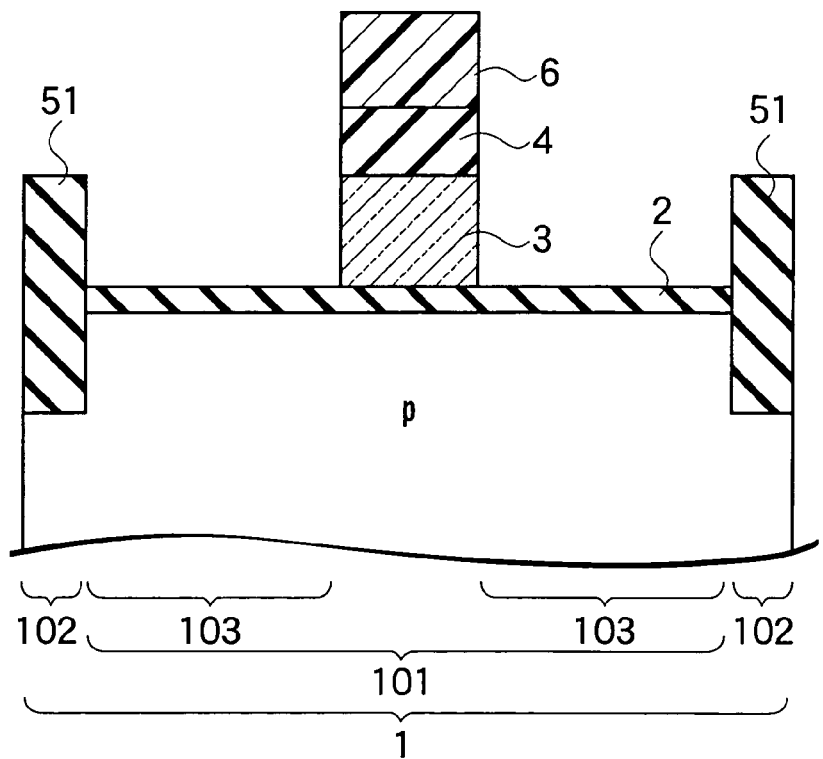
Figure 27B:
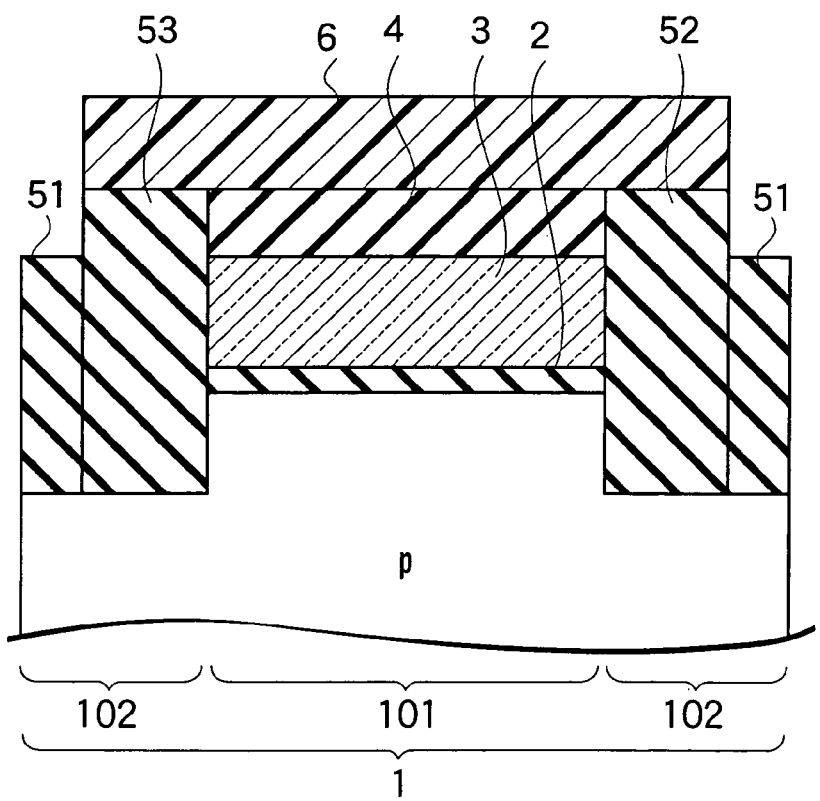

(c) As shown in FIGS. 27A and 27B, the polysilicon 3 is anisotropically etched by using the resist 6 and the silicon oxide film 51 as a mask and the buffer oxide film 2 as a stopper. The resist 6 is removed. As a result, a dummy gate 3 and 4 is formed.

(d) The buffer oxide film 2 is anisotropically etched by using the silicon nitride film 4 as a mask and the silicon substrate 1 as a stopper. As a result, a top surface of the silicon oxide film 51, which is lower than the dummy gate 3 and 4, is formed in the isolation area 102. Source and drain areas 103 are formed in the active area 101 with areas located under the dummy gate 3 and 4 excluded. In the top surface of the source and drain areas 103, a top surface of the silicon substrate 1 is exposed.

(e) LDD regions 11 and 14 and halo regions 12 and 15 are subject to the ion implantations of the extension and the halo by using the silicon nitride film 4 in the dummy gate as a mask. Thereafter, annealing for recovery from damage caused by the ion implantation is performed.

Figure 28:
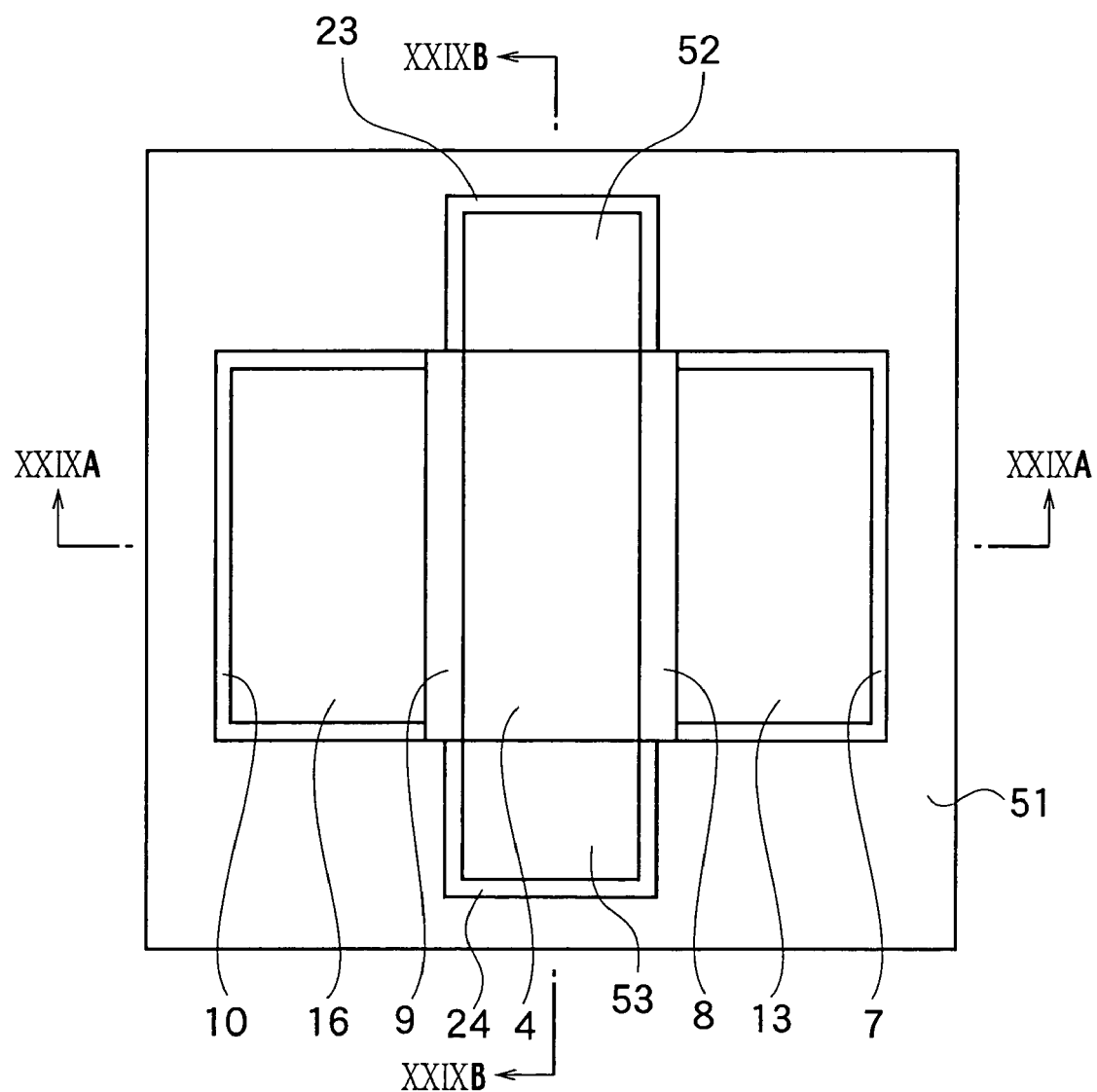
FIG. 28 is a top view of a semiconductor device in the middle of manufacture.
Figure 29A:
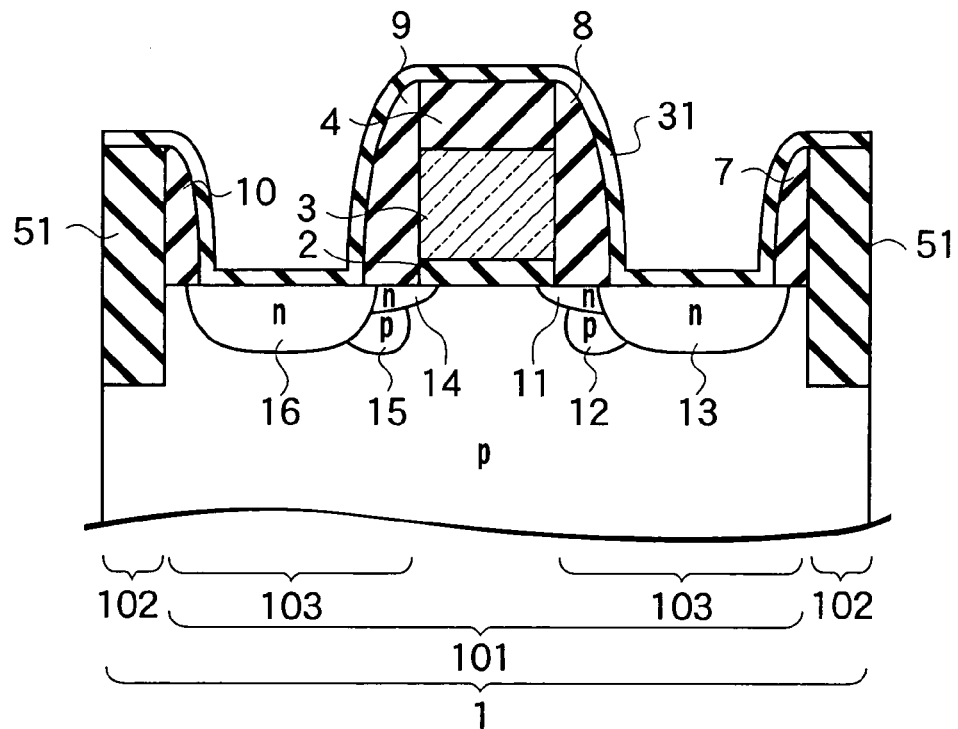
FIG. 29A is a cross-sectional view of a semiconductor device in the middle of manufacture, taken in a direction XXIXA—XXIXA shown in FIG. 28.
Figure 29B:
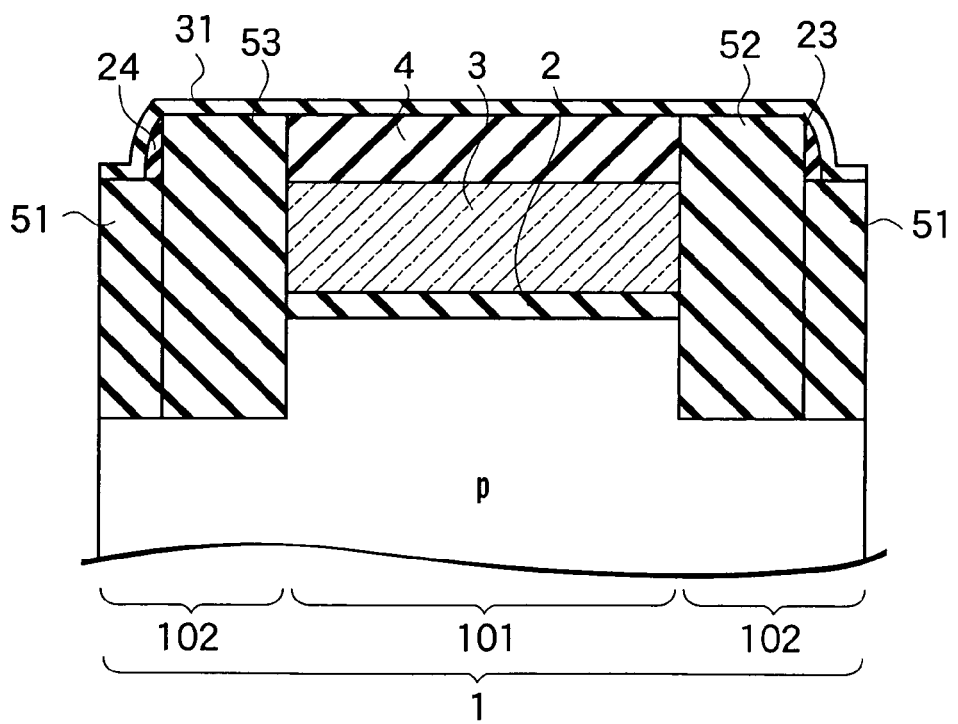
FIG. 29B is a cross-sectional view of a semiconductor device in the middle of manufacture, taken in a direction XXIXB—XXIXB shown in FIG. 28.

(f) As shown in FIGS. 28, 29A and 29B, side walls 7 to 10 are formed in a peripheral part of the source and drain areas 103. In addition, side walls 23 and 24 are formed so as to be in contact with side faces of silicon insulation films 52 and 53, respectively.

(g) A silicon oxide film 31 is deposited over the entire wafer surface in a conformal manner, that is, to cover all other elements. As shown in FIGS. 28, 29A and 29B, ion implantation is conducted to the source and source impurity diffusion layers 13 and 16, and annealing for activating the implanted impurities and recovering from damage caused by the ion implantation is conducted.

Figure 31A:
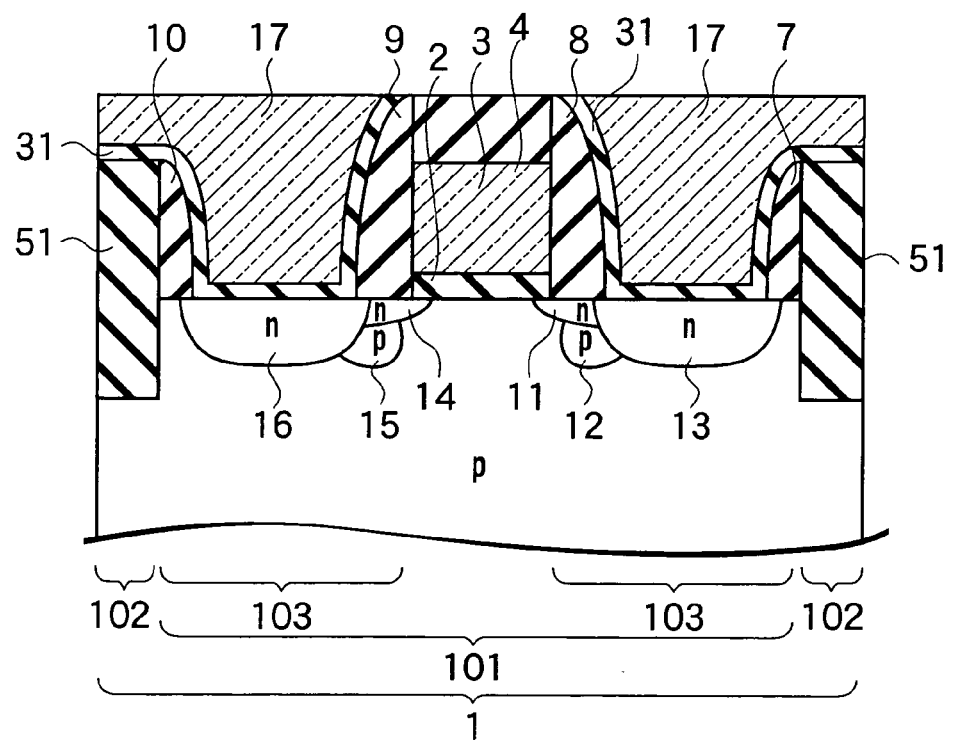
FIG. 31A is a cross-sectional view of a semiconductor device in the middle of manufacture, taken in a direction XXXIA—XXXIA shown in FIG. 30.
Figure 31B:
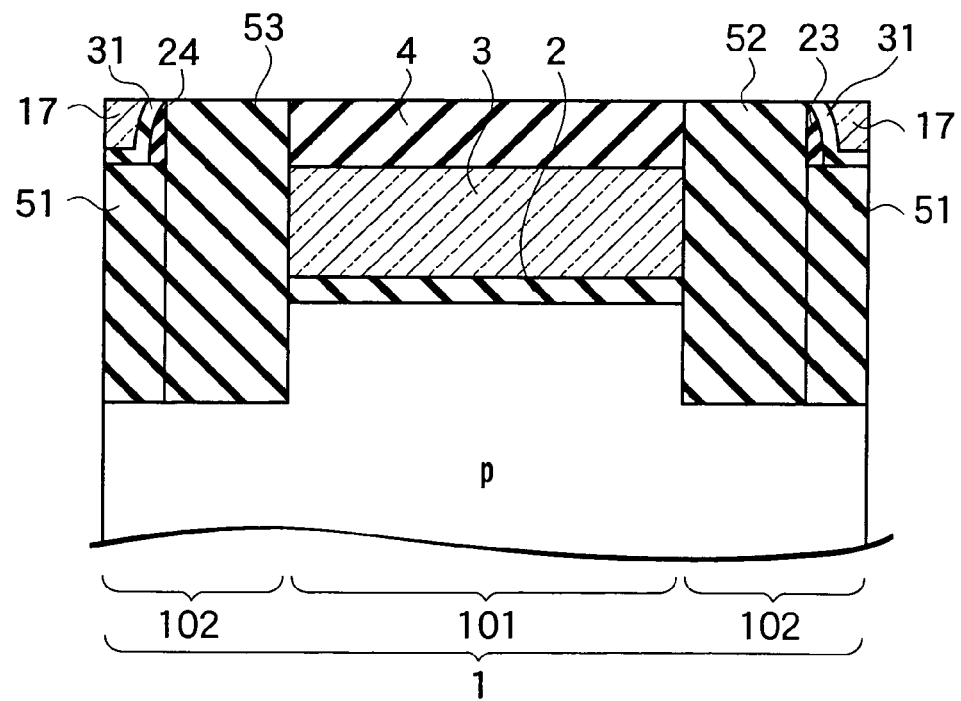
FIG. 31B is a cross-sectional view of a semiconductor device in the middle of manufacture, taken in a direction XXXIB—XXXIB shown in FIG. 30.

(h) A polysilicon film 17 is deposited over the entire wafer surface by using the CVD method. As shown in FIGS. 30, 31A and 31B, the polysilicon film 17 is polished as far as the top surface of the silicon nitride film 4 by CMP.

Figure 32A:
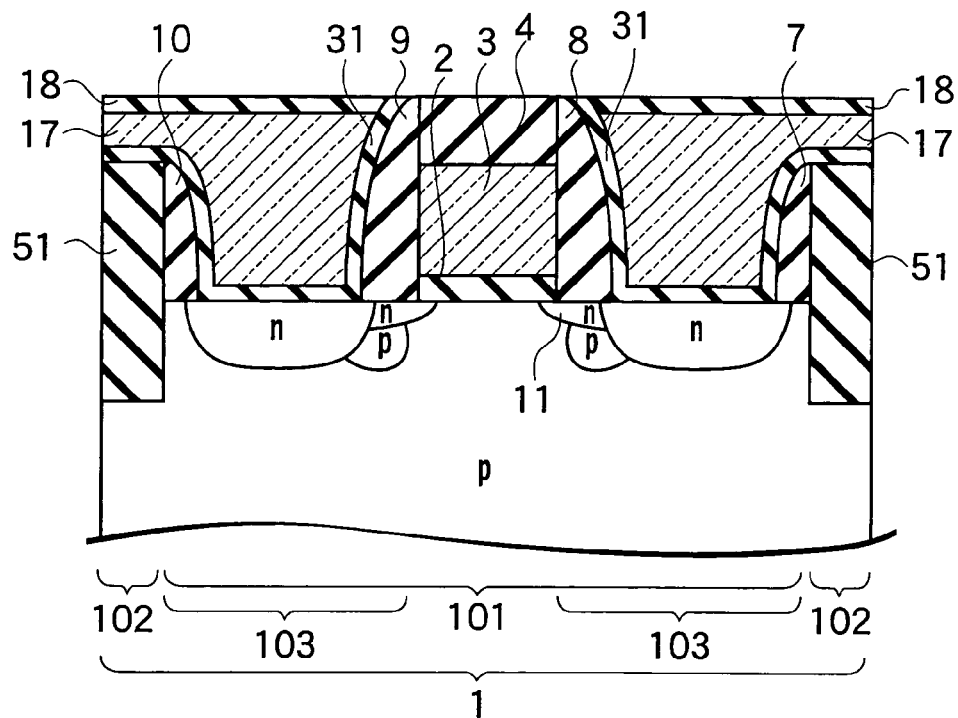
FIG. 32A is a cross-sectional view of a semiconductor device in the middle of manufacture, cut in the same direction as FIG. 31A.
Figure 32B:
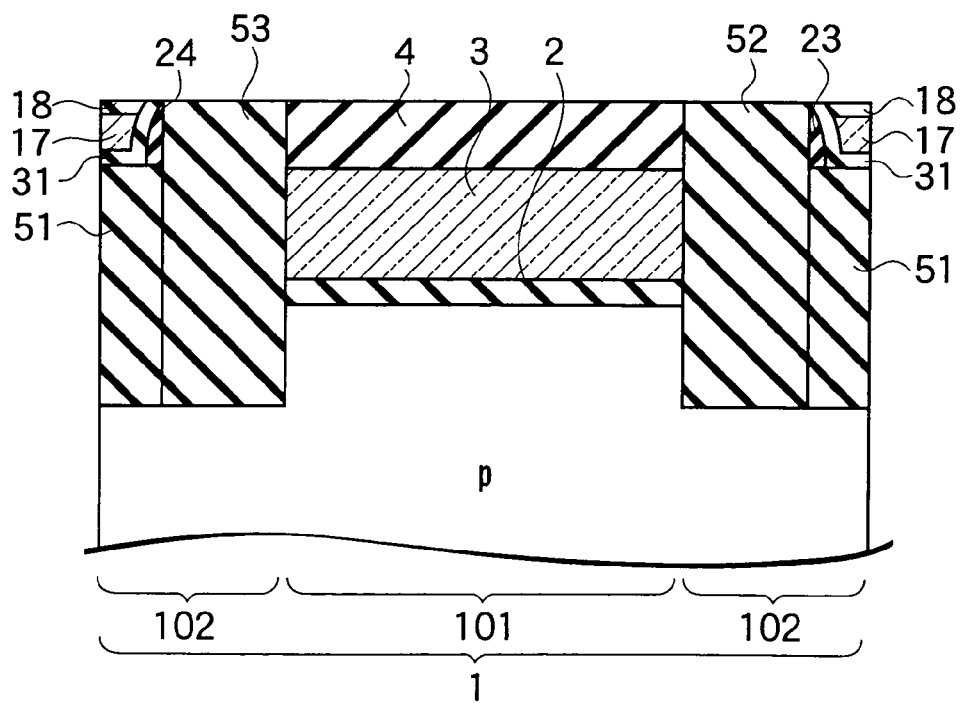
FIG. 32B is a cross-sectional view of a semiconductor device in the middle of manufacture, cut in the same direction as FIG. 31B.
Figure 33:
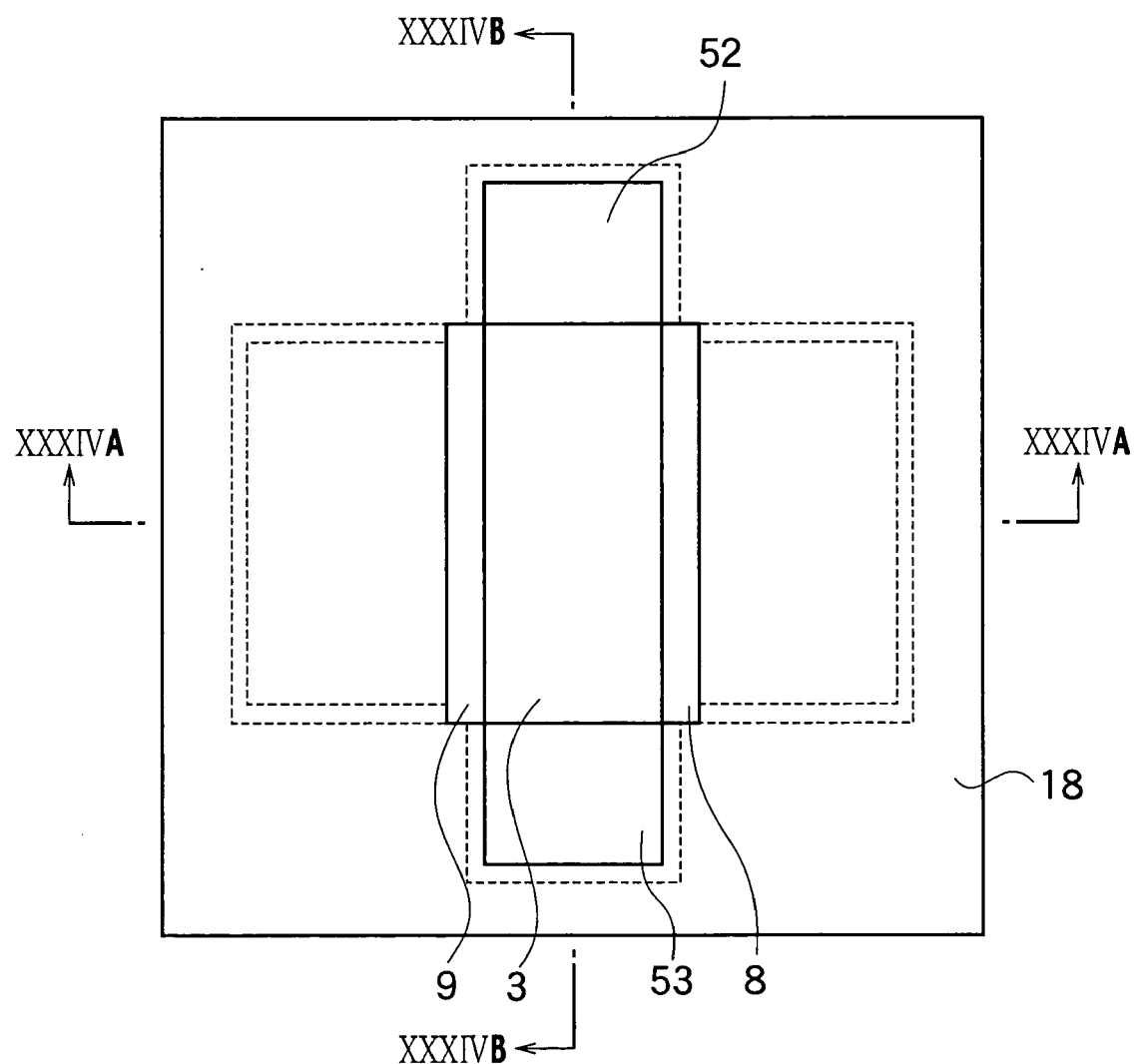
FIG. 33 is a top view of a semiconductor device in the middle of manufacture.

(i) As shown in FIGS. 32A and 32B, a top surface of the polysilicon film 17 is subject to thermal oxidation to form a silicon oxide film 18.

Figure 34A:
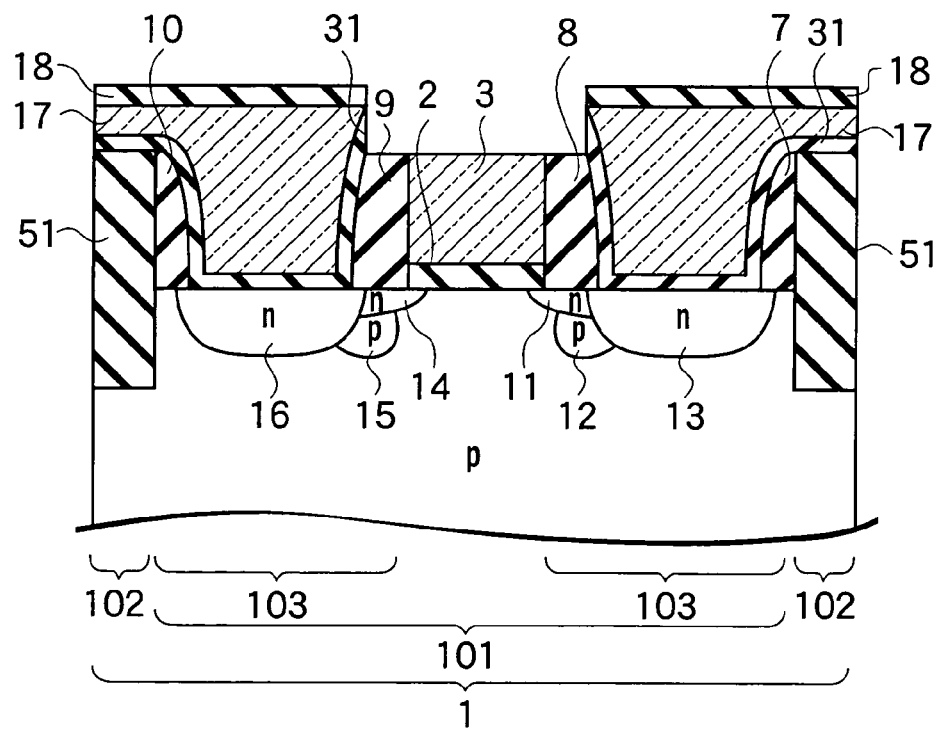
FIG. 34A is a cross-sectional view of a semiconductor device in the middle of manufacture, taken in a direction XXXIVA—XXXIVA shown in FIG. 33.
Figure 34B:
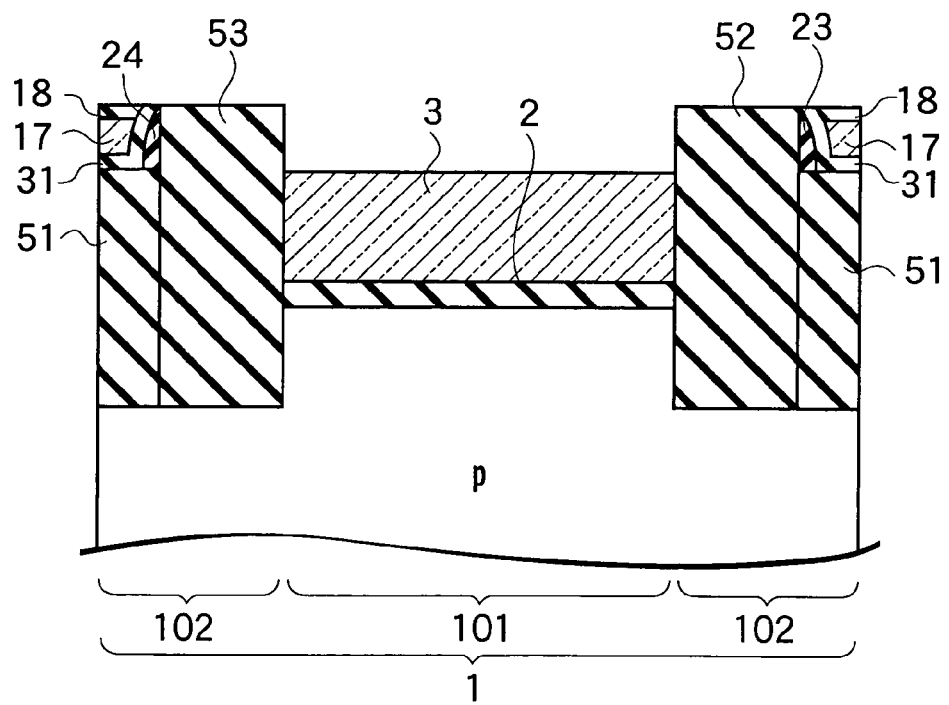
FIG. 34B is a cross-sectional view of a semiconductor device in the middle of manufacture, taken in a direction XXXIVB—XXXIVB shown in FIG. 33.

(j) As shown in FIGS. 34A and 34B, the silicon nitride film 4 is etched by using the silicon oxide films 18, 52 and 53 as a mask. In addition, top portions of side walls 8 and 9 are etched.

Figure 35A:
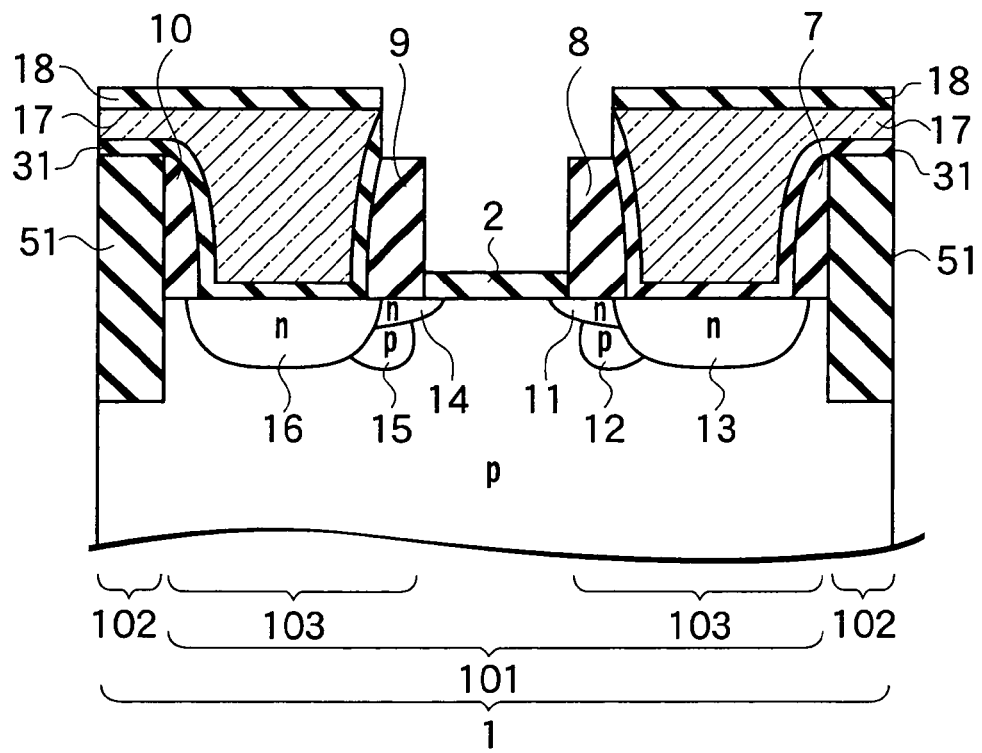
FIG. 35A is a cross-sectional view of a semiconductor device in the middle of manufacture, cut in the same direction as FIG. 34A.
Figure 35B:
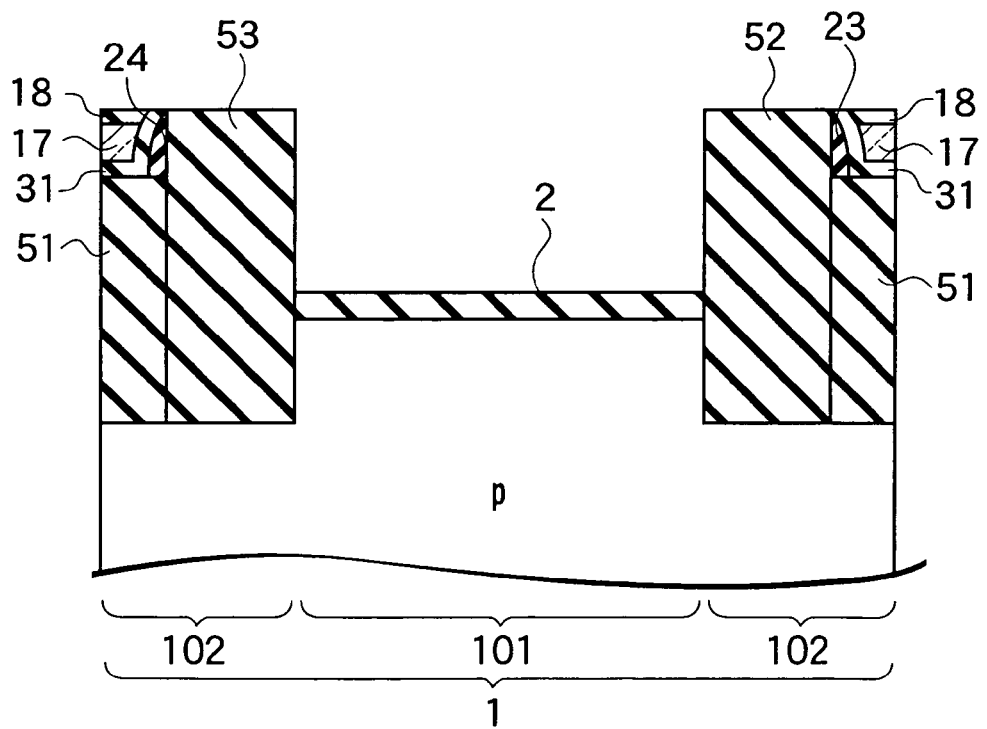
FIG. 35B is a cross-sectional view of a semiconductor device in the middle of manufacture, cut in the same direction as FIG. 34B.

(k) As shown in FIGS. 35A and 35B, the polysilicon 3 is etched by using the silicon oxide films 18, 52 and 53 and using the buffer oxide film 2 as a stopper.

Figure 36:
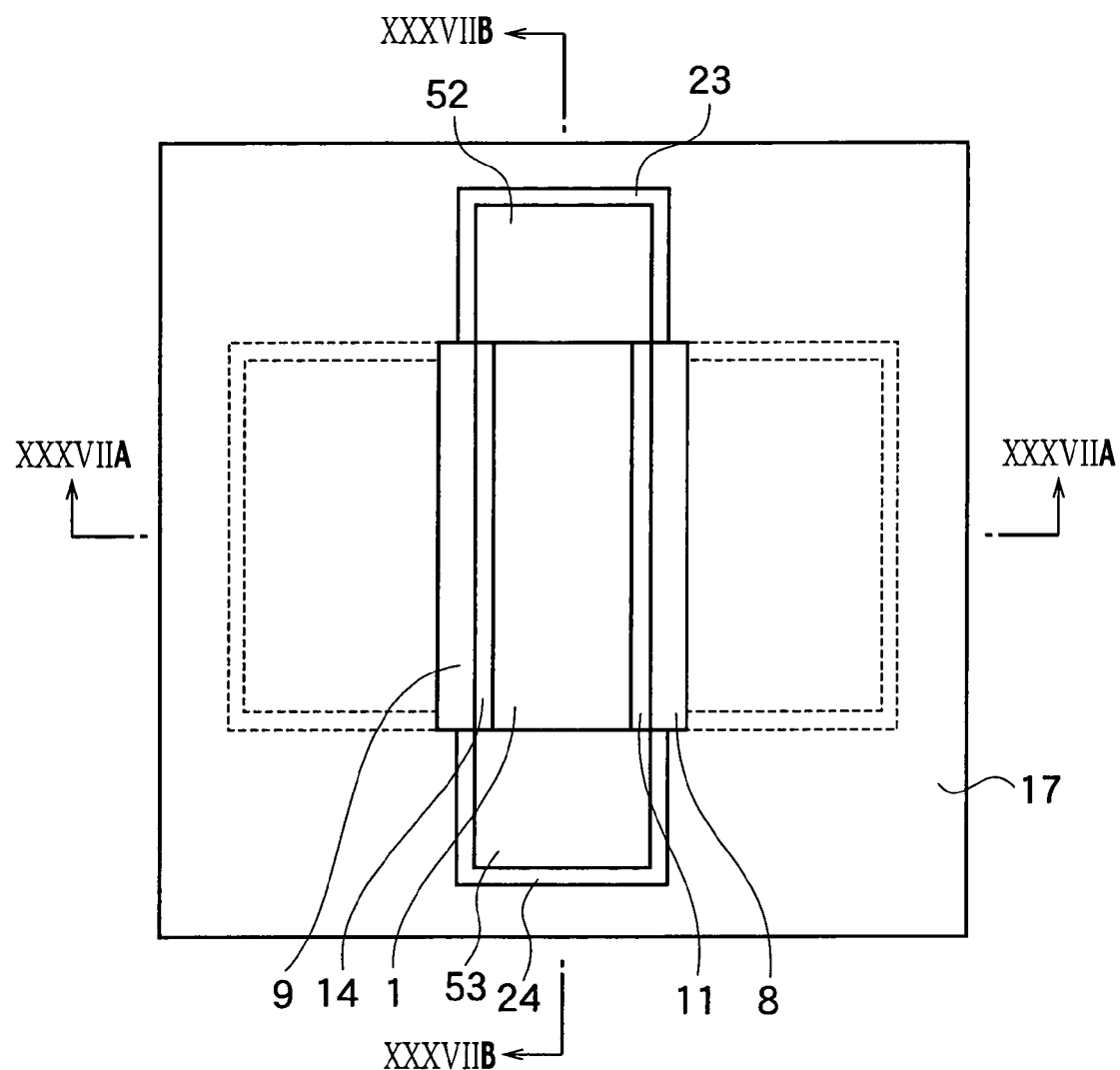
FIG. 36 is a top view of a semiconductor device in the middle of manufacture.
Figure 37A:
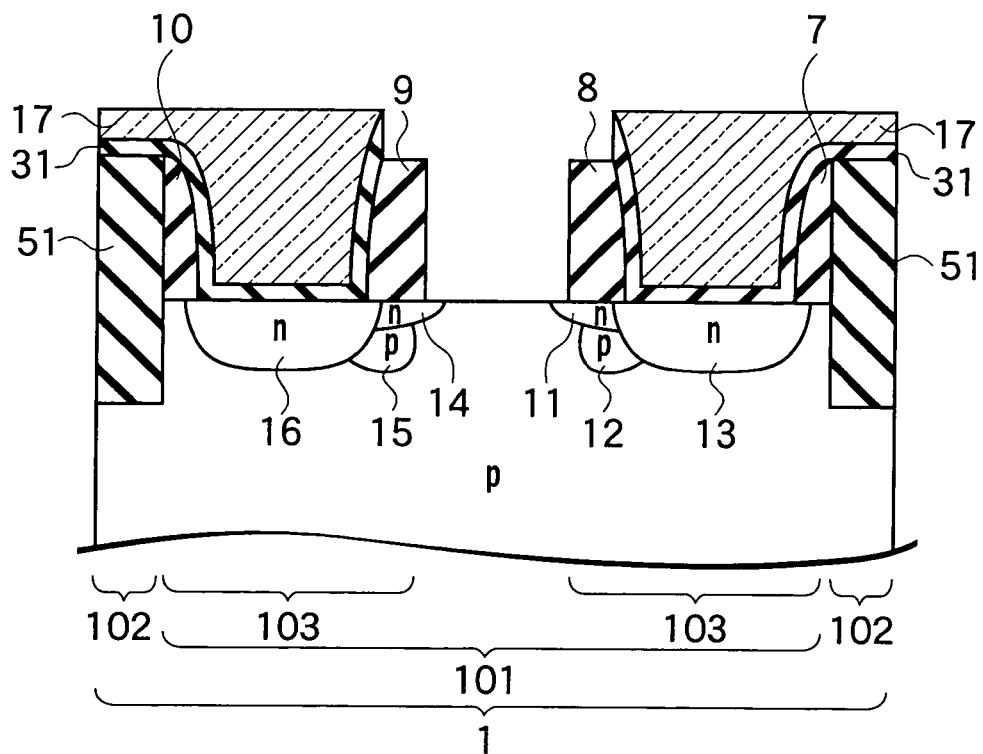
FIG. 37A is a cross-sectional view of a semiconductor device in the middle of manufacture, taken in a direction XXXVIIA—XXXVIIA shown in FIG. 36.
Figure 37B:
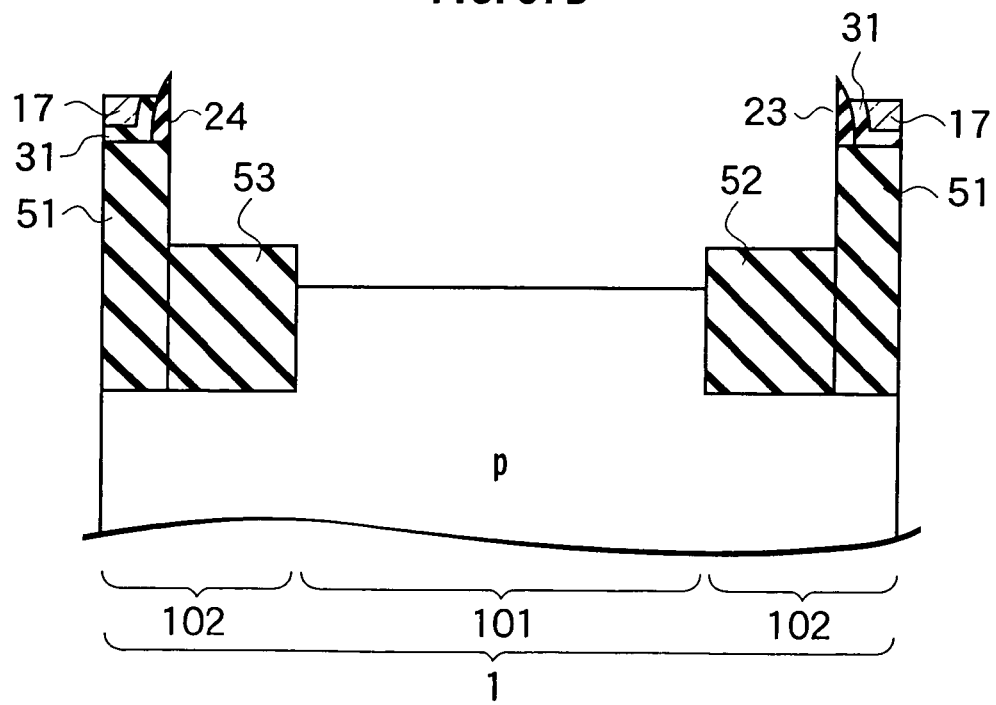
FIG. 37B is a cross-sectional view of a semiconductor device in the middle of manufacture, taken in a direction XXXVIIB—XXXVIIB shown in FIG. 36.

(l) As shown in FIGS. 36, 37A and 37B, the silicon oxide films 52 and 53 are etched and retreated and the silicon oxide film 18 and the buffer oxide film 2 are removed, by using the polysilicon film 17 and the semiconductor substrate 1 as an etching stopper.

Figure 38:
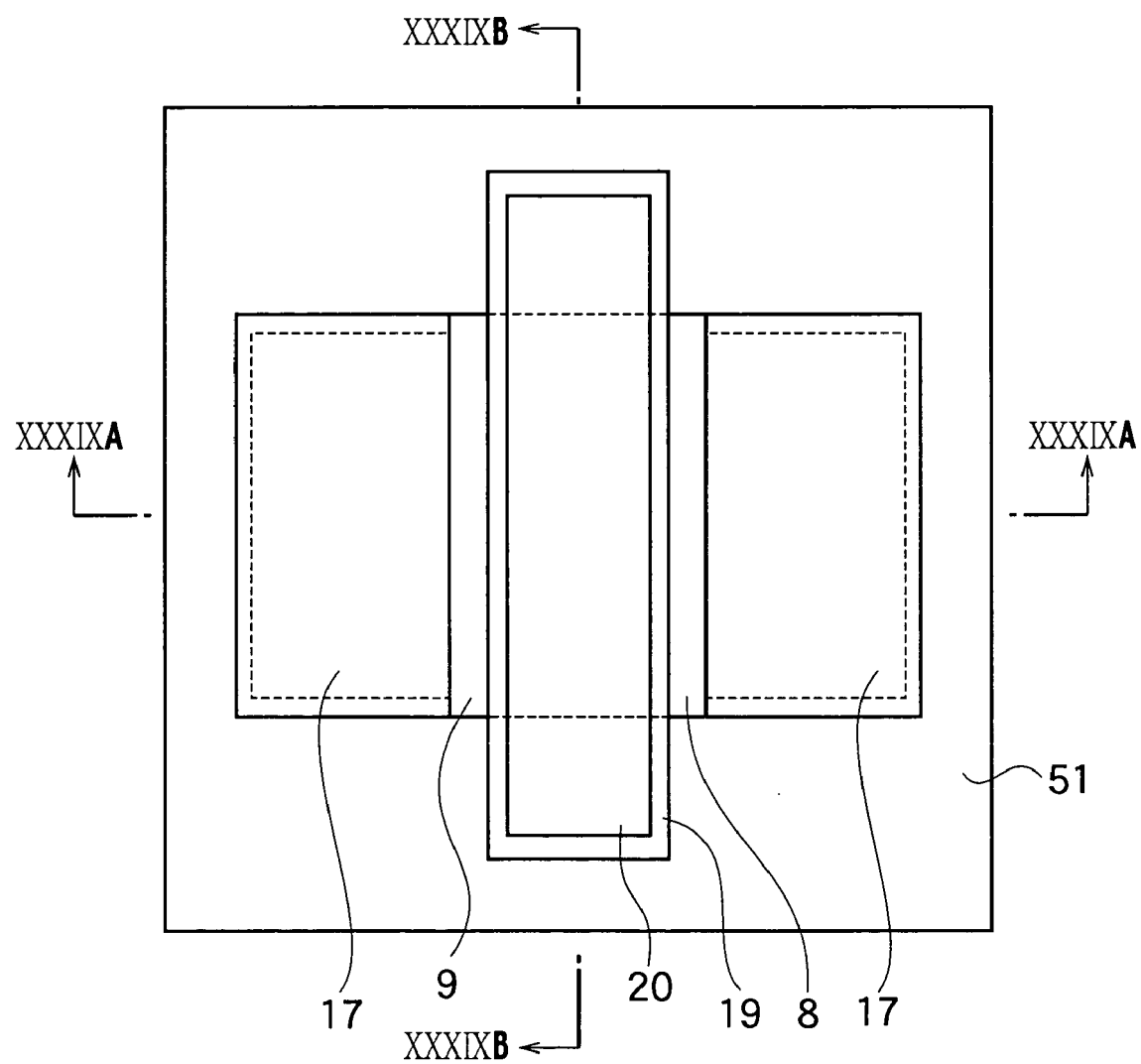
FIG. 38 is a top view of a semiconductor device in the middle of manufacture.
Figure 39A:
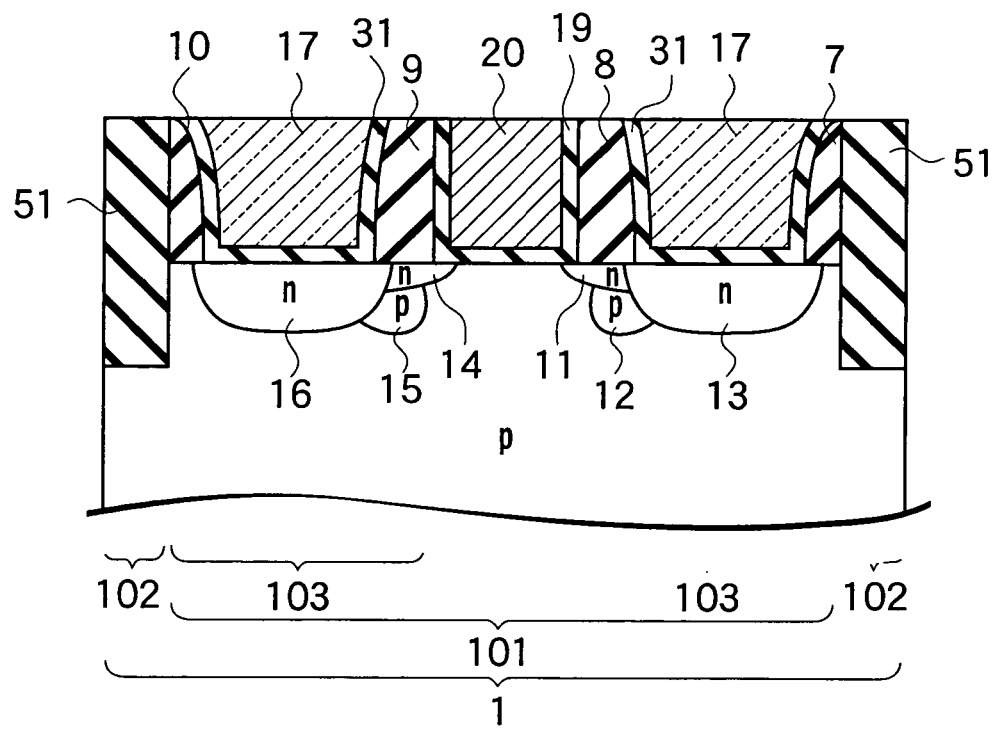
FIG. 39A is a cross-sectional view of a semiconductor device in the middle of manufacture, taken in a direction XXXIXA—XXXIXA shown in FIG. 38.
Figure 39B:
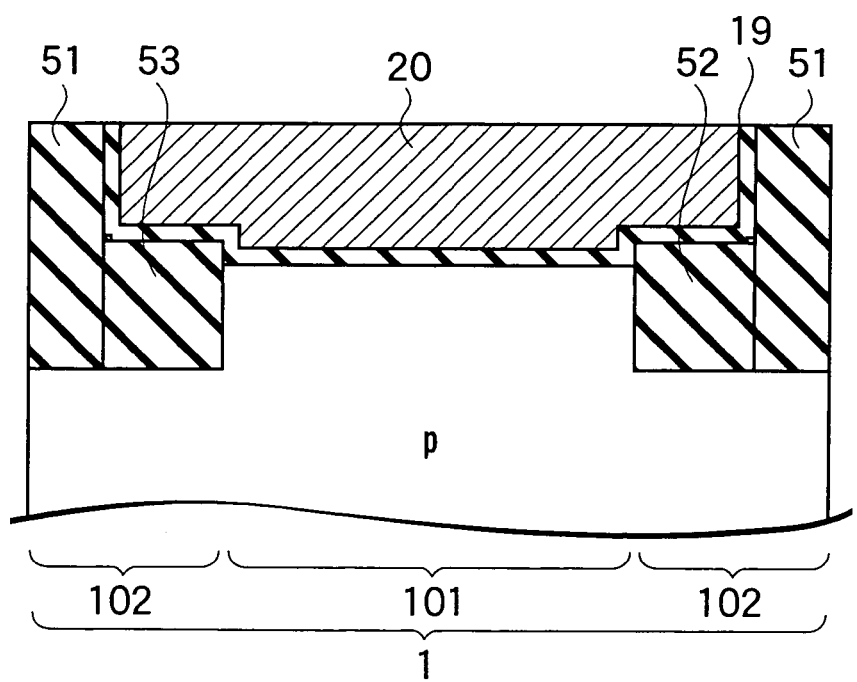
FIG. 39B is a cross-sectional view of a semiconductor device in the middle of manufacture, taken in a direction XXXIXB—XXXIXB shown in FIG. 38.

(m) A gate insulation film 19 is deposited. Metal as a gate electrode material is deposited. The metal is polished up to the top surface of the silicon oxide film 51. As shown in FIGS. 38, 39A and 39B, therefore, the gate insulation film 19 and a gate electrode 20 are embedded in the gate trench.

(n) The polysilicon film 17 is removed by using the silicon oxide film 31 as a stopper and using the CDE. In addition, the silicon oxide film 31 is anisotropically etched by using the side walls 7 to 10 and the silicon substrate 1 as a stopper. At this time, the silicon oxide film 51 is also etched. However, there is not a great change in the structure of the semiconductor device. A top surface of the source impurity diffusion layer 13 and a top surface of the drain impurity diffusion layer 16 are exposed.

Figure 41A:
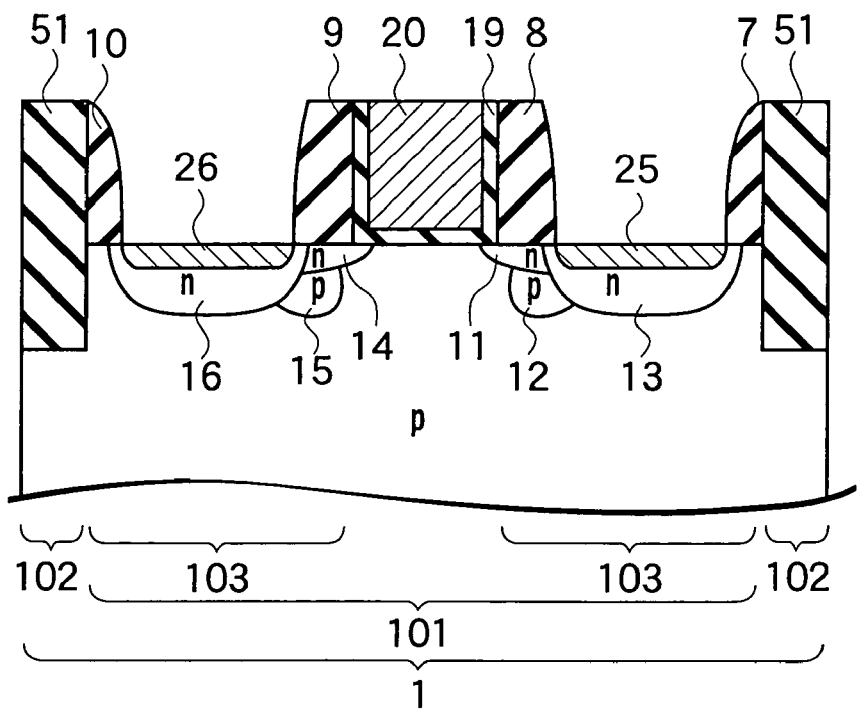
FIG. 41A is a cross-sectional view of a semiconductor device in the middle of manufacture, taken in a direction XLIA—XLIA shown in FIG. 40.
Figure 41B:
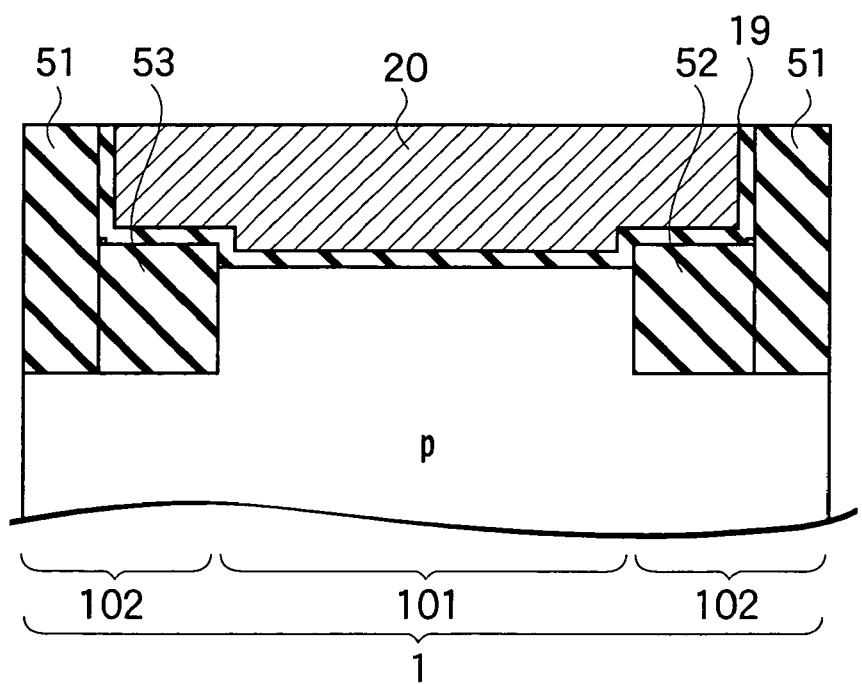
FIG. 41B is a cross-sectional view of a semiconductor device in the middle of manufacture, taken in a direction XLIB—XLIB shown in FIG. 40.

(o) A metal film is formed over the entire wafer surface. The metal film and the silicon substrate 1 are heated and reacted to form siliside layers 25 and 26 so as to encroach on the silicon substrate 1 in contact with the metal film. As shown in FIGS. 40, 41A and 41B, the metal film which is not yet reacted is etched selectively with respect to the silicide layers 25 and 26. Because of the side walls 7 and 10, the silicide layers 25 and 26 are not in contact with the side faces of the silicon insulation film 51.

(p) Metal is deposited over the entire wafer surface inclusive of top surfaces of the silicide layers 25 and 26. As shown in FIGS. 24, 25A and 25B, metal deposited on top surfaces of the side walls 8 and 9 and the silicon insulation film 51 is polished and removed by CMP.

(q) Subsequent portions in the method of manufacturing the semiconductor device are the same as in the method of manufacturing the semiconductor device in the first embodiment.

According to the second embodiment, it is possible in the gate electrode 20 to decrease the gate resistance, prevent the gate depletion, and improve the drive capability of the transistor itself. In the source electrode 21 and the drain electrode 22, the on-resistance between the source and the drain can be decreased as compared with the first embodiment without increasing the leakage current.

(Variant of Second Embodiment)

Figure 42A:
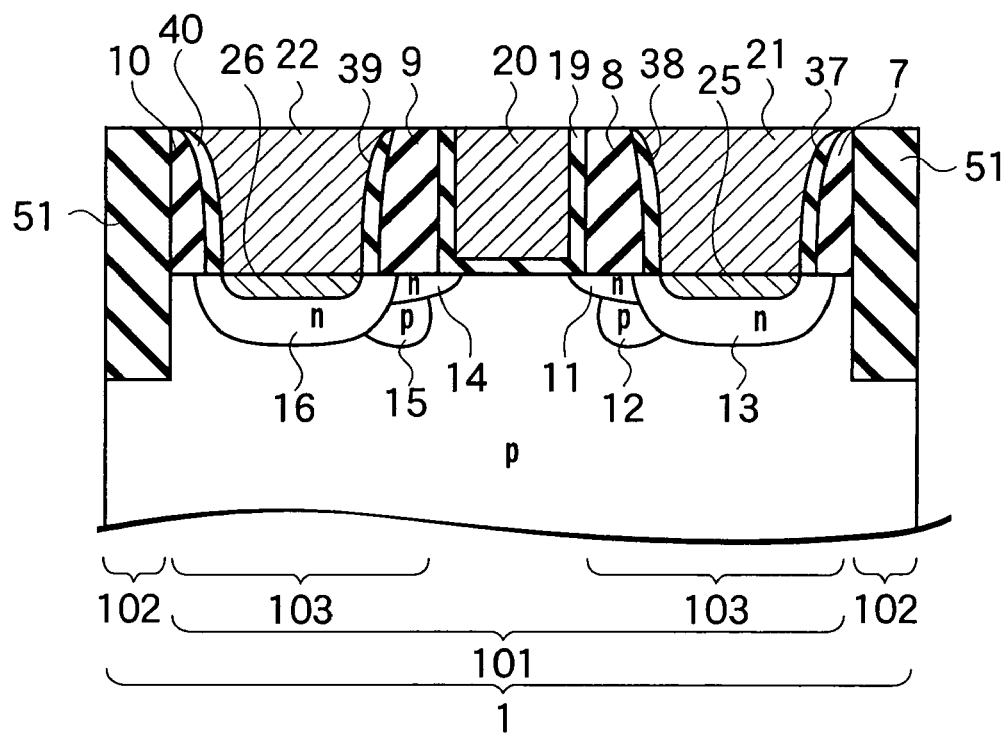
FIG. 42A is a cross-sectional view of a semiconductor device according to a variant of a second embodiment of the present invention, taken in a direction XXVA—XXVA shown in FIG. 24.
Figure 42B:
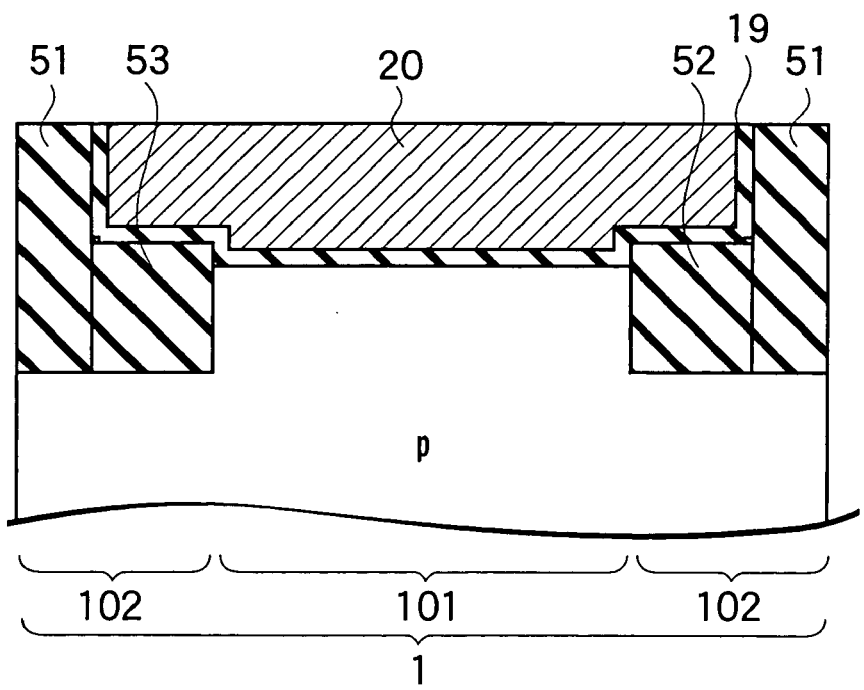
FIG. 42B is a cross-sectional view of a semiconductor device according to a variant of a second embodiment of the present invention, taken in a direction XXVB—XXVB shown in FIG. 24.

As shown in FIGS. 42A and 42B, a semiconductor device according to a variant for the second embodiment of the present invention differs from the semiconductor device according to the second embodiment shown in FIGS. 25A and 25B in the structures of the side walls 7 to 10 and 37 to 40 and the side wall peripheral structures.

Unlike the single-layer structure in the semiconductor device in the second embodiment, the side walls 7 to 10 and 37 to 40 have two-layer structures in which silicon oxide films 37 to 40 and silicon nitride films 7 to 10 are respectively combined in a direction of a line perpendicular to the side faces.

The silicide layers 25 and 26 can be further spaced from the silicon oxide film 51 by approximately the film thickness of the silicon oxide films 37 to 40. In the semiconductor device of the variant of the second embodiment, it is difficult for a leakage current to flow between the silicide layers 25 and 26 and the semiconductor substrate 1 located under the source and drain impurity diffusion layers 13 and 16.

A method of manufacturing the semiconductor device according to the variant of the second embodiment of the present invention will now be described.

(a) An initial part of the method of manufacturing the semiconductor device in the variant of the second embodiment is the same as that shown far as FIG. 39B in the method of manufacturing the semiconductor device in the second embodiment.

(b) The polysilicon film 17 is removed by using the silicon oxide film 31 as a stopper and using the CDE. In addition, the silicon oxide film 31 is anisotropically etched by using the silicon substrate 1 as a stopper. A top surface of the source impurity diffusion layer 13 and a top surface of the drain impurity diffusion layer 16 are exposed. Side walls 37 to 40 are formed.

Figure 43A:
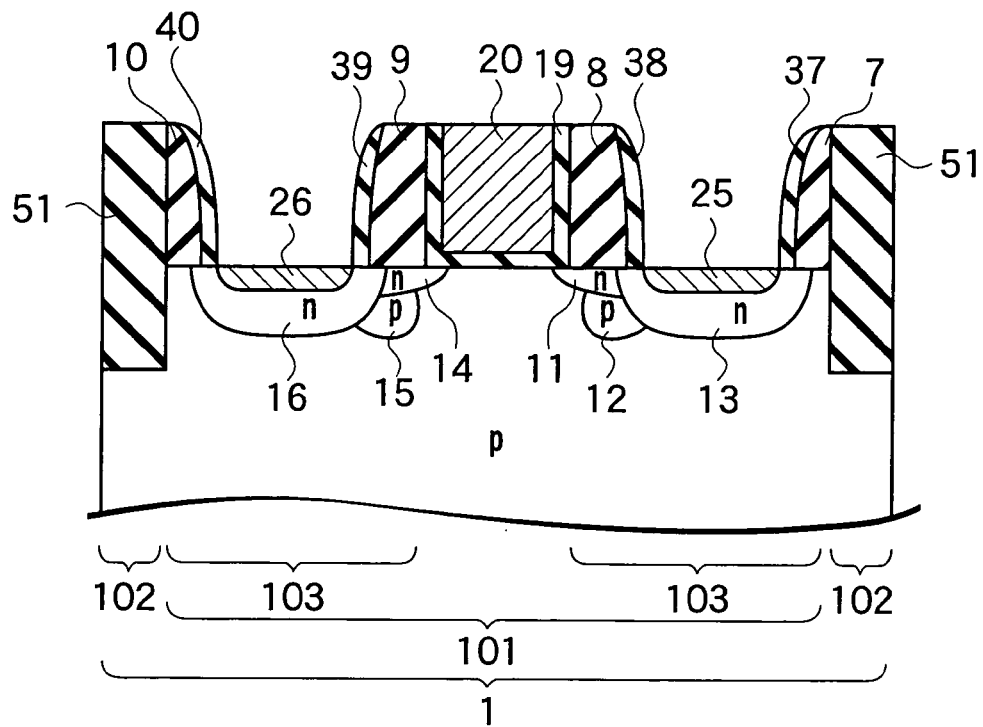
FIG. 43A is a cross-sectional view of a semiconductor device according to a variant of a second embodiment in the middle of manufacture, cut in the same direction as FIG. 42A.
Figure 43B:
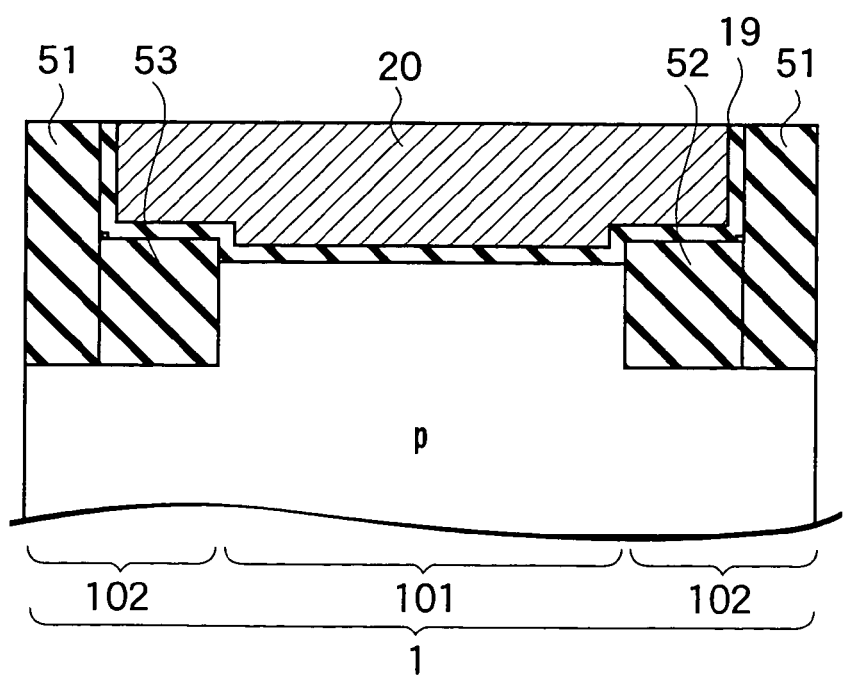
FIG. 43B is a cross-sectional view of a semiconductor device according to a variant of a second embodiment in the middle of manufacture, cut in the same direction as FIG. 42B.

(c) A metal film is formed over the entire wafer surface. The metal film and the silicon substrate 1 are heated and reacted to form silicide layers 25 and 26 so as to encroach on the silicon substrate 1 in contact with the metal film. As shown in FIGS. 43A and 43B, the metal film which is not yet reacted is etched selectively with respect to the silicide layers 25 and 26. The silicide layers 25 and 26 are further spaced from the side faces of the silicon insulation film 51 by the side walls 37 and 40.

(d) Metal is deposited over the entire wafer surface inclusive of top surfaces of the silicide layers 25 and 26. As shown in FIGS. 42A and 42B, metal deposited on top surfaces of the side walls 8 and 9 and the silicon insulation film 51 is polished and removed by CMP.

(e) Subsequent portions in the method manufacturing of the semiconductor device are the same as in the method of manufacturing the semiconductor device in the first embodiment.

According to the variant of the second embodiment, it is possible in the gate electrode 20 to decrease the gate resistance, prevent the gate depletion, and improve the drive capability of the transistor itself. In the source electrode 21 and the drain electrode 22, the on-resistance between the source and the drain can be decreased as compared with the first embodiment without increasing the leakage current.

The present invention is not limited to the above-described embodiments. Without departing from the spirit of the present invention, various modifications can be effected.

As for the metal electrode forming method, besides embedding the metal electrode in the trench by CMP, the gate electrode may be processed by conducting anisotropic etching such as RIE after the resist and patterning.

The silicon substrate 1 may be any semiconductor substrate. The semiconductor substrate may be a semiconductor substrate of a silicon layer of a silicon on insulator (SOI) substrate, a silicon germanium (SiGe) mixed crystal, or silicon germanium carbide (SiGeC) mixed crystal. Without departing from the spirit of the present invention, various modifications can be effected. Other types of silicide including other material may be used in the first and second embodiment.

Various modifications will become possible for those skilled in the art after receiving the teachings of the present disclosure without departing from the scope thereof.

What is claimed is:

1. A semiconductor device comprising:
   a semiconductor substrate having a first top surface assigned in an active area and a second top surface lower than the first top surface assigned in an isolation area surrounding the active area in a top view;
   an isolation insulator including first insulators disposed on the second top surface, having a third top surface higher than the first top surface, and a second insulator disposed on the second top surface, partially in contact with the outer side faces of the first insulators, having a fourth top surface higher than the third top surface;

a source side wall insulator including a first side wall contacted to the first top surface and the inner side face of the second insulator, and a second side wall disposed on the first top surface and having ends respectively in contact with ends of the first side wall;

a drain side wall insulator including a third side wall contacted to the first top surface and the inner side face of the second insulator, and a fourth side wall disposed on the first top surface, parallel to the second side wall and having ends respectively in contact with ends of the third side wall;

a gate insulation film contacted to the first top surface and the third top surface and in contact with side faces of the second insulator, the second side wall and the fourth side wall;

a gate conductor disposed on the gate insulation film and having a side face in contact with the gate insulation film;

a source conductor electrically connected to the first top surface, and having a side face in contact with the source side wall insulator; and a drain conductor electrically connected to the first top surface, and having a side face in contact with the drain side wall insulator.

2. The semiconductor device as in claim 1, wherein heights of tops of the first side wall and the third side wall are equal to or less than a height of the fourth top surface.

3. The semiconductor device as in claim 1, wherein heights of tops of the second side wall and the fourth side wall are equal to a height of the fourth top surface.

4. The semiconductor device as in claim 1, wherein heights of tops of the gate insulation film and the gate conductor are equal to a height of the fourth top surface.

5. The semiconductor device as in claim 1, wherein heights of tops of the source conductor and the drain conductor are equal to a height of the fourth top surface.

6. The semiconductor device as in claim 1, wherein the gate conductor is metal.

7. The semiconductor device as in claim 1, wherein the gate conductor is silicide.

8. The semiconductor device as in claim 1, wherein the source conductor and the drain conductor are metal.

9. The semiconductor device as in claim 1, wherein the source conductor and the drain conductor are silicide.

10. The semiconductor device as in claim 1, wherein the gate insulation film comprises a high dielectric substance that permitivity is higher than that of silicon oxide.

11. The semiconductor device as in claim 1, wherein
the semiconductor substrate has a first type of conductivity, and
the semiconductor substrate further comprises a source impurity diffusion layer having a second type of conductivity different from the first type of conductivity, disposed under the source conductor and including the first top surface, and a drain impurity diffusion layer having a type of conductivity the same as the second type of conductivity, disposed under the drain conductor and including the first top surface.

12. The semiconductor device as in claim 1, further comprising:
a source silicide layer disposed between the first top surface and the source conductor; and
a drain silicide layer disposed between the first top surface and the drain conductor.

13. The semiconductor device as in claim 1, wherein each of the first side wall, the second side wall, the third side wall and the fourth side wall has a two-layer structure having a lower layer of a silicon oxide film and an upper layer of a silicon nitride film.

14. The semiconductor device as in claim 1, wherein each of the first side wall, the second side wall, the third side wall and the fourth side wall has a two-wall structure having an outer wall of a silicon oxide film and an inner wall of a silicon nitride film.

* * * * *